(12) United States Patent
Hamazaki et al.

(10) Patent No.: US 11,493,396 B2
(45) Date of Patent: Nov. 8, 2022

(54) PRESSURE DETECTION ELEMENT AND PRESSURE DETECTION APPARATUS

(71) Applicant: Murata Manufacturing Co., Ltd., Nagaokakyo (JP)

(72) Inventors: Ryohei Hamazaki, Nagaokakyo (JP); Daiki Tsuji, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 161 days.

(21) Appl. No.: 17/035,804

(22) Filed: Sep. 29, 2020

(65) Prior Publication Data
US 2021/0063263 A1 Mar. 4, 2021

Related U.S. Application Data

(63) Continuation of application No. PCT/JP2019/015987, filed on Apr. 12, 2019.

(30) Foreign Application Priority Data

May 22, 2018 (JP) .............................. JP2018-098181
Mar. 4, 2019 (JP) .............................. JP2019-038510

(51) Int. Cl.
*G01L 9/12* (2006.01)
*G01L 9/00* (2006.01)
*B81B 3/00* (2006.01)

(52) U.S. Cl.
CPC .......... *G01L 9/0072* (2013.01); *B81B 3/0067* (2013.01); *G01L 9/0042* (2013.01)

(58) Field of Classification Search
CPC ......... G01L 1/142; G01L 1/144; G01L 1/146; G01L 1/148; G01L 9/0005; G01L 9/0041;
(Continued)

(56) References Cited

U.S. PATENT DOCUMENTS

2007/0107524 A1   5/2007   O'Brien et al.
2008/0202251 A1   8/2008   Serban et al.
(Continued)

FOREIGN PATENT DOCUMENTS

JP    56-142432 A    11/1981
JP    05-231974 A     9/1993
(Continued)

OTHER PUBLICATIONS

Dfficial Communication issued in International Patent Application No. PCT/JP2019/015987, dated May 14, 2019.

*Primary Examiner* — Herbert K Roberts
(74) *Attorney, Agent, or Firm* — Keating & Bennett, LLP

(57) ABSTRACT

A pressure detection element includes a substrate, first and second electrodes on the substrate, a membrane including a first diaphragm portion and a second diaphragm portion and spaced from the substrate, and a spacer between the substrate and the membrane to define a first space in which the first electrode and the first diaphragm portion are spaced from and opposed to each other and a second space in which the second electrode and the second diaphragm portion are spaced from and opposed to each other. The substrate includes a trench in a portion positioned between the first diaphragm portion and the second diaphragm portion when viewed in a direction in which the substrate and the membrane are opposed.

18 Claims, 16 Drawing Sheets

(58) Field of Classification Search
CPC ... G01L 9/0042; G01L 9/0072; G01L 9/0073; G01L 9/0075; G01L 9/12; G01L 9/125; B81B 3/0067; B81B 3/007; B81B 3/0072; B81B 3/0075; B81B 3/0078; B81C 1/00158

See application file for complete search history.

(56) References Cited

U.S. PATENT DOCUMENTS

2015/0226624 A1* 8/2015 Kuisma ................ G01L 9/0073
73/715
2019/0273200 A1* 9/2019 Sato ................... H01L 41/1138

FOREIGN PATENT DOCUMENTS

| | | | |
|---|---|---|---|
| JP | 11-295176 A | | 10/1999 |
| JP | 11295176 A | * | 10/1999 |
| JP | 3102595 B2 | * | 10/2000 |
| JP | 2002195903 A | * | 7/2002 |
| JP | 2010-021225 A | | 1/2010 |
| JP | 2010021225 A | * | 1/2010 |
| JP | 2011-011325 A | | 1/2011 |
| JP | 2015-043103 A | | 3/2015 |
| JP | 2016-526157 A | | 9/2016 |

* cited by examiner

PRESSURE DETECTION ELEMENT AND PRESSURE DETECTION APPARATUS

CROSS REFERENCE TO RELATED APPLICATIONS

This application claims the benefit of priority to Japanese Patent Application No. 2019-038510 filed on Mar. 4, 2019 and Japanese Patent Application No. 2018-098181 filed on May 22, 2018, and is a Continuation Application of PCT Application No. PCT/JP2019/015987 filed on Apr. 12, 2019. The entire contents of each application are hereby incorporated herein by reference.

BACKGROUND OF THE INVENTION

1. Field of the Invention

The present invention relates to electrostatic-capacitive pressure detection elements and pressure detection apparatuses including the same.

2. Description of the Related Art

As one example of an electrostatic-capacitive pressure detection element, a pressure detection element is described in Japanese Unexamined Patent Application Publication No. 2016-526157, the pressure detection element including a diaphragm and a wafer (substrate) spaced from and opposed to the diaphragm. The substrate includes electrodes. In the pressure detection element described in Japanese Unexamined Patent Application Publication No. 2016-526157, the substrate and the diaphragm are each shaped in the same rectangle when viewed in their opposing direction and have a dimension in a long direction at least three times as long as the dimension in a short direction.

Thus, in the substrate and the diaphragm, deflection in the short direction is reduced, and they tend to be deflected in the long direction. With this, when an external force acts on the pressure detection element, the diaphragm and the substrate are deflected mainly to the long direction and thus the deflected shapes of both match. As a result, even if the pressure detection element is deflected by an external force, the distance between the diaphragm and the electrodes on the substrate is maintained, as with a case in which no external force acts on the pressure detection element.

For example, when the pressure detection element with the diaphragm exposed is buried in a resin package, a large external force acts on the pressure detection element due to thermal expansion and curing shrinkage of mold resin, which is a material of the resin package. When a large external force acts in this manner, even if the dimension of the substrate and the diaphragm in the long direction is at least three times as long as the dimension thereof in the short direction like the pressure detection element described in Japanese Unexamined Patent Application Publication No. 2016-526157, the diaphragm may be deflected and deformed to the short direction. As a result, the distance between the diaphragm and the electrodes on the substrate can change.

SUMMARY OF THE INVENTION

Preferred embodiments of the present invention are each able to reduce, in a electrostatic-capacitive pressure detection element, a change in distance between a diaphragm and electrodes on a substrate occurring as a result of deflection of the pressure detection element.

A pressure detection element according to a preferred embodiment of the present invention includes a substrate; first and second electrodes provided on the substrate; a membrane including a first diaphragm portion and a second diaphragm portion, the membrane being spaced from the substrate; and a spacer between the substrate and the membrane to define a first space in which the first electrode and the first diaphragm portion are spaced from and opposed to each other and a second space in which the second electrode and the second diaphragm portion are spaced from and opposed to each other, and the substrate includes a trench in a portion positioned between the first diaphragm portion and the second diaphragm portion when viewed in a direction in which the substrate and the membrane are opposed.

A pressure detection apparatus according to a preferred embodiment of the present invention includes a pressure detection element according to a preferred embodiment of the present invention; and a resin package with the pressure detection element buried therein and including an exposure hole from which the first and second diaphragm portions of the pressure detection element are exposed to outside.

According to preferred embodiments of the present invention, in each of electrostatic-capacitive pressure detection elements, it is possible to reduce a change in distance between the diaphragm and the electrodes on the substrate occurring as a result of deflection of the pressure detection element.

The above and other elements, features, steps, characteristics and advantages of the present invention will become more apparent from the following detailed description of the preferred embodiments with reference to the attached drawings.

DETAILED DESCRIPTION OF PREFERRED EMBODIMENTS

Figure 1:
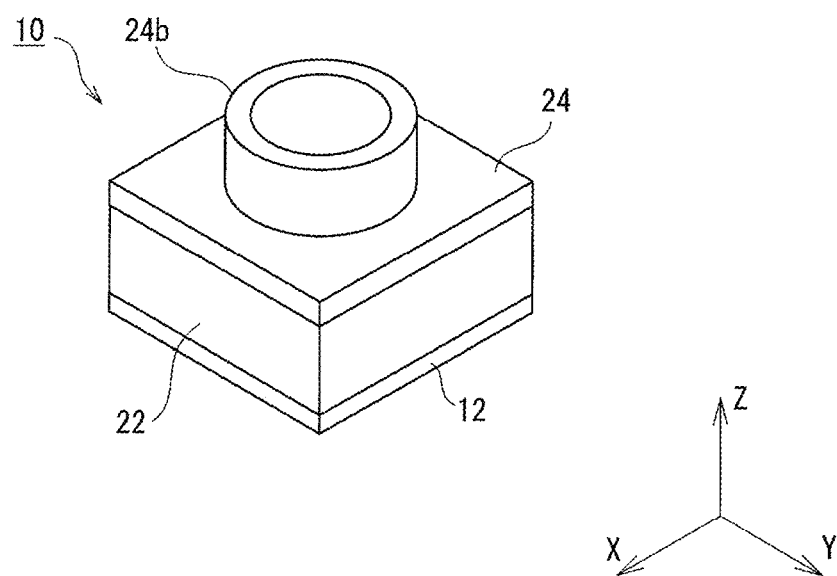
FIG. 1 is a perspective view of a pressure detection apparatus according to a first preferred embodiment of the present invention.

A pressure detection element according to a preferred embodiment of the present invention includes a substrate, first and second electrodes provided on the substrate, a membrane including a first diaphragm portion and a second diaphragm portion, the membrane being spaced from the substrate, and a spacer member between the substrate and the membrane to define a first space in which the first electrode and the first diaphragm portion are spaced from and opposed to each other and a second space in which the second electrode and the second diaphragm portion are spaced from and opposed to each other. The substrate includes a trench in a portion positioned between the first diaphragm portion and the second diaphragm portion when viewed in a direction in which the substrate and the membrane are opposed.

In the electrostatic-capacitive pressure detection element, it is possible to reduce a change in distance between the diaphragm and the electrodes on the substrate occurring as a result of deflection of the pressure detection element.

For example, the trench may be provided in a surface of the substrate on the membrane side.

For example, the first and second diaphragm portions may each have a rectangular or substantially rectangular shape with a long direction and a short direction, when viewed in the direction in which the substrate and the membrane are opposed, and may be aligned to the short direction, and the trench may extend to the long direction.

For example, the trench preferably has a length in an extending direction equal to or longer than a length in the first and second diaphragm portions in the long direction. This allows the deflected shape of the first and second diaphragm portions and the deflected shape of the corresponding portion of the substrate to match more closely in the pressure detection element which is deflected by receiving an external force.

For example, when viewed in the direction in which the substrate and the membrane are opposed, the first and second electrodes may each include at least either of concave portions provided at a center or approximate center of edges on both ends in the long direction and concave portions provided at a center of edges on a central side of the membrane. With this, the first and second electrodes are not opposed to portions of the first and second diaphragm portions where deformation significantly different from that of the other portions occurs. This enables the pressure acting on the membrane to be measured (calculated) with high accuracy based on the electrostatic capacitance between the first and second diaphragm portions and the first and second electrodes.

For example, cavities may be provided in portions of the substrate facing the first and second spaces so as to interpose the first and second electrodes in the long direction when viewed in the direction in which the substrate and the membrane are opposed. This enables the increased pressure in the first and second spaces to escape to the cavity.

For example, cavities may be provided in the substrate so as to be positioned at four corners of each of the first and second spaces when viewed in the direction in which the substrate and the membrane are opposed. This enables the increased pressure in the first and second spaces to escape to the cavity.

For example, the spacer member may include communication paths via which the first space, the second space, and the trench communicate. This enables the pressure in the first and second spaces to escape to the trench.

For example, an additional space may be provided, the additional space being arranged at a position in an outer side portion of the first and second diaphragm portions except a portion between the first and second diaphragm portions, when viewed in the direction in which the substrate and the membrane are opposed, and communicating with the first and second spaces. This enables the increased pressure in the first and second spaces to escape to the additional space.

For example, it is preferable that the trench is provided at a center or approximate center in the substrate in a parallel or substantially parallel direction of the first diaphragm portion and the second diaphragm portion and the first and second diaphragm portions are symmetric with respect to the trench.

A pressure detection apparatus according to another preferred embodiment of the present invention includes a pressure detection element according to a preferred embodiment of the present invention, and a resin package including the pressure detection element buried therein and including an exposure hole from which the first and second diaphragm portions of the pressure detection element are exposed outside.

In the electrostatic-capacitive pressure detection element, it is possible to reduce a change in distance between the diaphragm and the electrodes on the substrate occurring as a result of deflection of the pressure detection element by receiving an external force from the resin package.

In the following, preferred embodiments of the present invention are described with reference to the drawings.

First Preferred Embodiment

Figure 2:
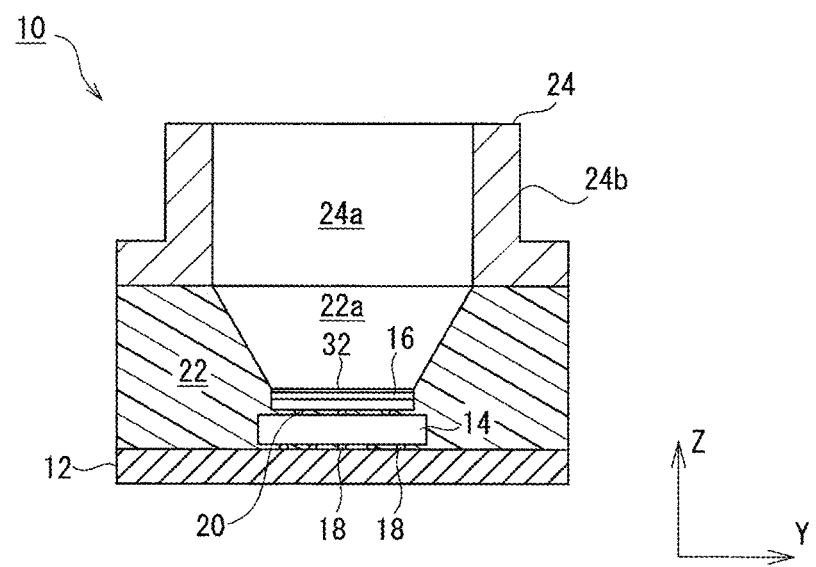
FIG. 2 is a sectional view of the pressure detection apparatus according to the first preferred embodiment of the present invention.

FIG. 1 is a perspective view of a pressure detection apparatus according to a first preferred embodiment of the present invention. FIG. 2 is a sectional view of the pressure detection apparatus according to the first preferred embodiment. Note that an X-Y-Z orthogonal coordinate system depicted in these drawings is for ease of understanding of the present invention and is not meant to limit the present invention.

A pressure detection apparatus 10 according to the first preferred embodiment is a pressure sensor for measuring pressure and includes, as depicted in FIG. 1 and FIG. 2, a base substrate 12, a circuit element 14 provided on the base substrate 12, and a pressure detection element 16 provided on the circuit element 14.

As depicted in FIG. 2, the circuit element 14 is, for example, an element including an application specific integrated circuit (ASIC). Also, the circuit element 14 is electrically connected to the base substrate 12 via bumps 18. In place of the bumps 18, the circuit element 14 may be electrically connected to the base substrate 12 via a bonding wire.

The pressure detection element 16 is an electrostatic-capacitive pressure sensor element and is a micro electro mechanical systems (MEMS) element. Also, the pressure detection element 16 is electrically connected to the circuit element 14 via bumps 20. In place of the bumps 20, the pressure detection element 16 may be electrically connected to the circuit element 14 via a bonding wire. Note that further details of the pressure detection element 16 will be described further below.

The circuit element 14 and the pressure detection element 16 are buried in a resin package 22 provided on the base substrate 12. However, to enable the pressure detection element 16 to detect pressure, a membrane (details will be described further below), which is a portion of the pressure detection element 16, is exposed outside via an exposure hole 22a in the resin package 22.

The resin package 22 is provided with a bracket member 24 to attach the pressure detection apparatus 10 to, for example, an electronic device. The bracket member 24 includes a cylindrical portion 24b with an inner space 24a communicating with the exposure hole 22a in the resin package 22. In a state in which an O ring (not depicted) fits in an outer peripheral surface, the cylindrical portion 24b is inserted into a through hole of the electronic device.

In the following, details of the pressure detection element 16 are described.

Figure 3:
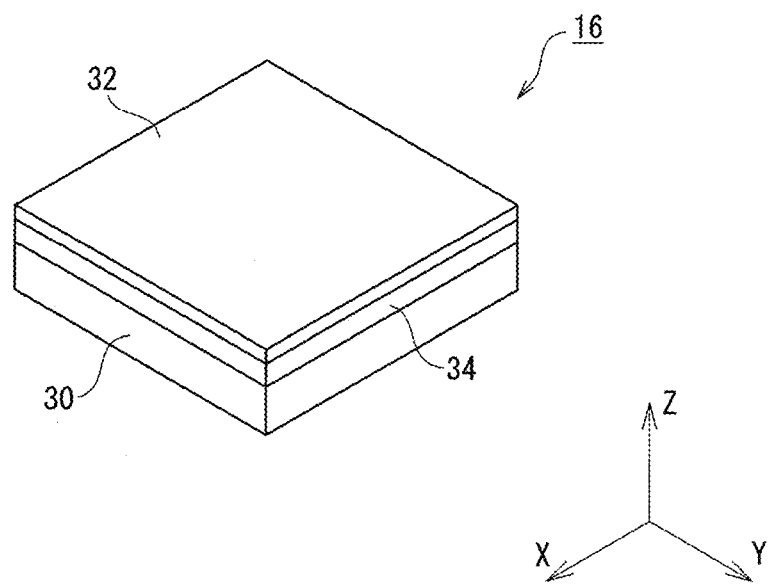
FIG. 3 is a perspective view of a pressure detection element according to the first preferred embodiment of the present invention.
Figure 4:
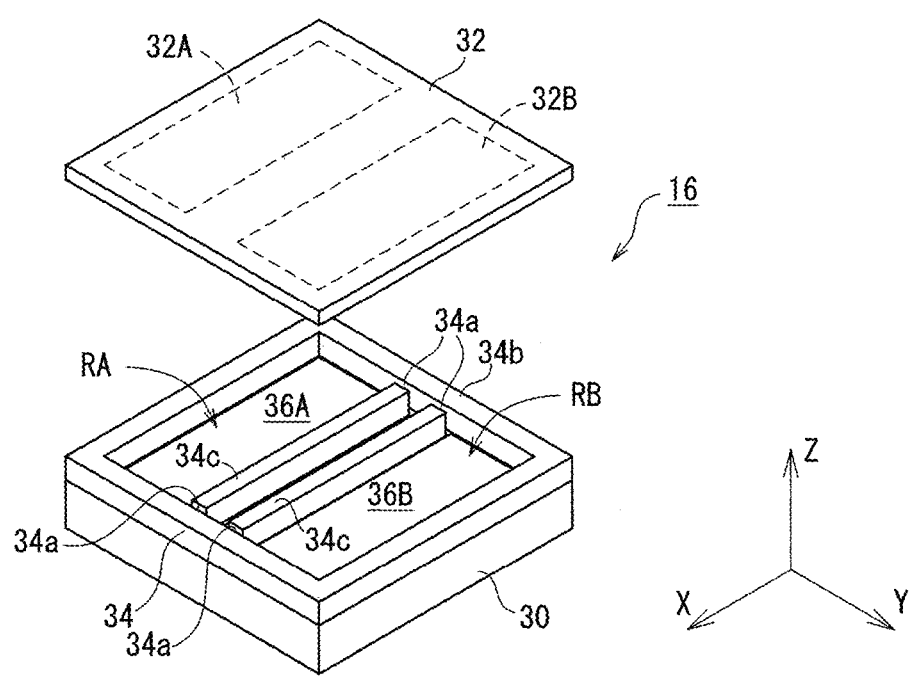
FIG. 4 is an exploded perspective view of the pressure detection element according to the first preferred embodiment of the present invention in a state in which a membrane is removed.
Figure 5:
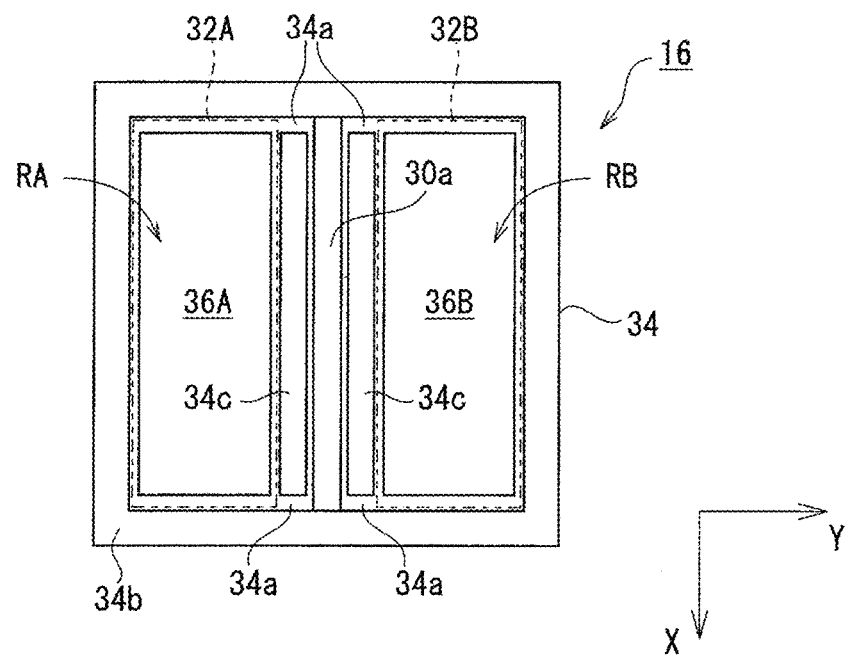
FIG. 5 is a top view of the pressure detection element according to the first preferred embodiment of the present invention with the membrane omitted.
Figure 6:
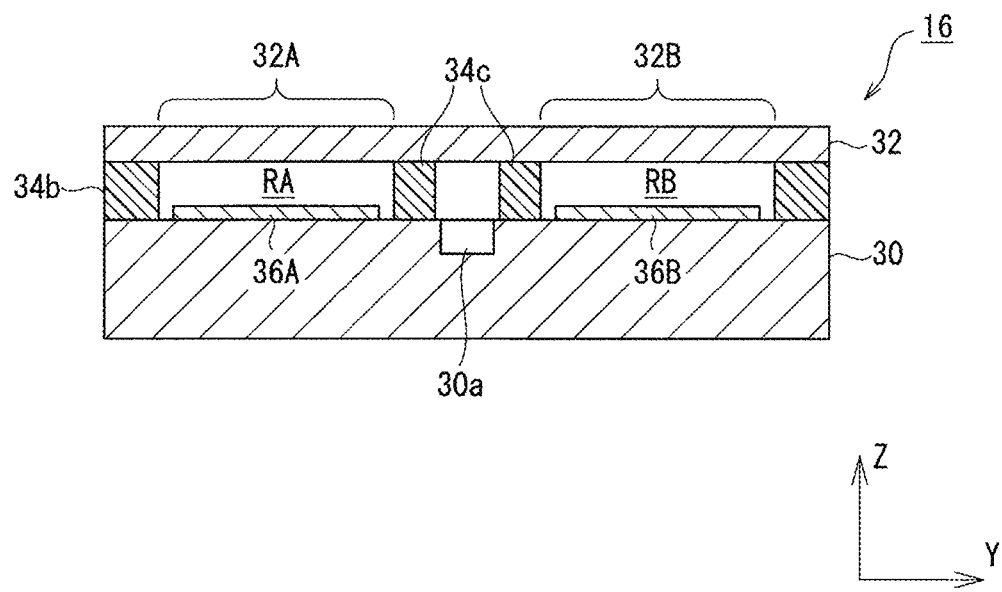
FIG. 6 is a sectional view of the pressure detection element according to the first preferred embodiment of the present invention.

FIG. 3 is a perspective view of the pressure detection element according to the first preferred embodiment. FIG. 4 is an exploded perspective view of the pressure detection element according to the first preferred embodiment in a state in which a membrane is removed. FIG. 5 is a top view of the pressure detection element according to the first preferred embodiment with the membrane omitted. And, FIG. 6 is a sectional view of the pressure detection element according to the first preferred embodiment.

As shown in FIG. 3 and FIG. 4, the pressure detection element 16 is an electrostatic-capacitive pressure detection device, and includes a substrate 30, a membrane 32 spaced from the substrate 30, a spacer member 34 interposed between the substrate 30 and the membrane 32, and first and second electrodes 36A and 36B provided on the substrate 30.

The substrate 30 of the pressure detection element 16 is, for example, a rectangular-shaped wafer in the first preferred embodiment. In the first preferred embodiment, the substrate 30 preferably has a thickness (length in a Z-axis direction) of 200 μm, for example.

The membrane 32 is a conductor made of, for example, a conductive silicon material, and having elasticity and conductivity. In the first preferred embodiment, the membrane 32 preferably has a rectangular or substantially rectangular shape and has a thickness (length in the Z-axis direction) of about 3 μm to about 5 μm, for example. Also, although details will be described further below, the membrane 32 includes a first diaphragm portion 32A and a second diaphragm portion 32B, which are portions to be displaced when pressure acts on them. In the first preferred embodiment, the first diaphragm portion 32A and the second diaphragm portion 32B each have a rectangular or substantially rectangular shape having a long direction (X-axis direction) and a short direction (Y-axis direction) when viewed in a direction in which the substrate 30 and the membrane 32 are opposed (viewed in the Z-axis direction) and aligned to that short direction (Y-axis direction).

The spacer member 34 is a buried oxide (box) layer preferably having a thickness (length in the Z-axis direction) of, for example, approximately 0.7 μm, and is interposed between the substrate 30 and the membrane 32 to define spaces therebetween. Specifically, the spacer member 34, together with the substrate 30 and the membrane 32, defines a first space RA and a second space RB. In detail, the ceiling plane of the first space RA is defined by the first diaphragm portion 32A, and the ceiling plane of the second space RB is defined by the second diaphragm portion 32B. Also, the substrate 30 defines the floor surfaces of the first and second spaces RA and RB, and the spacer member 34 defines the wall surfaces of the first and second spaces RA and RB.

In the first preferred embodiment, as with the first and second diaphragm portions 32A and 32B, the first space RA and the second space RB have a long direction (X-axis direction) and a short direction (Y-axis direction) when viewed in a direction in which the substrate 30 and the membrane 32 are opposed (viewed in the Z-axis direction). In the short direction, the first and second spaces RA and RB are aligned. Also, in the first preferred embodiment, the first and second spaces RA and RB communicate via communication paths 34a of the spacer member 34. Specifically, the spacer member 34 includes an outer frame portion 34b and two partition wall portions 34c dividing a space inside the outer frame part 34b broadly into two to define the first and second spaces RA and RB. A gap between the outer frame portion 34b and both ends of the partition wall portions 34c in the long direction (X-axis direction) defines the communication paths 34a via which the first space RA and the second space RB communicate. The reason for making the first space RA and the second space RB communicate in this manner will be described further below.

The first and second electrodes 36A and 36B are conductors preferably made of, for example, a conductive polysilicon material. The first electrode 36A is provided to a portion of the substrate 30 that can be spaced from and opposed to the first diaphragm portion 32A in the first space RA. The second electrode 36B is provided to a portion of the substrate 30 that can be spaced from and opposed to the second diaphragm portion 32B in the second space RB.

In the first preferred embodiment, the first and second electrodes 36A and 36B have shapes similar to the first and second diaphragm portions 32A and 32B, and each have a rectangular or substantially rectangular shape when viewed in the direction in which the substrate 30 and the membrane 32 are opposed (viewed in the Z-axis direction).

According to the pressure detection element 16 as configured above, a distance between the first diaphragm portion 32A and the first electrode 36A and a distance between the second diaphragm portion 32B and the second electrode 36B are changed due to pressure acting on the membrane 32. That is, electrostatic capacitance between the first diaphragm portion 32A and the first electrode 36A and electrostatic capacitance between the second diaphragm portion 32B and the second electrode 36B are changed. Based on the changes of these electrostatic capacitances, the pressure acting on the membrane 32 is measured (calculated).

In the following, further characteristics of the pressure detection element 16 are described.

As shown in FIG. 5 and FIG. 6, the substrate 30 of the pressure detection element 16 includes a trench 30a. Specifically, the trench 30a is provided between the first diaphragm portion 32A and the second diaphragm portion 32B when viewed in the direction in which the substrate 30 and the membrane 32 are opposed (viewed in the Z-axis direction).

In the first preferred embodiment, the trench 30a is provided in a surface of the substrate 30 on a membrane 32 side. Also, in the first preferred embodiment, the trench 30a extends in the long direction (X-axis direction) of the first and second diaphragm portions 32A and 32B, and the length of the trench 30a in an extending direction is equal or substantially equal to the length of the first and second diaphragm portions 32A and 32B in the long direction. Furthermore, in the first preferred embodiment, the trench 30a has a rectangular or substantially rectangular cross section (cross section orthogonal or substantially orthogonal to the extending direction) and extends linearly. Note that the length of the trench 30a in the extending direction may be longer compared with the length of the first and second diaphragm portions 32A and 32B in the long direction.

Also, in the first preferred embodiment, the trench 30a is provided at the center or approximate center in the substrate 30 in a parallel or substantially parallel direction (Y-axis direction) of the first diaphragm portion 32A and the second diaphragm portion 32B. The first diaphragm portion 32A and the second diaphragm portion 32B are symmetric with respect to that trench 30a.

Furthermore, in the first preferred embodiment, the trench 30a communicates with the first and second spaces RA and RB via the communication paths 34a of the spacer member 34.

The reason why the trench 30a as described above is provided in the substrate 30 is described below.

As shown in FIG. 2, the pressure detection element 16 is buried in the resin package 22, in a state in which the membrane 32 or at least the first and second diaphragm portions 32A and 32B are exposed outside.

Due to thermal expansion or curing shrinkage of a mold resin, which is a material of the resin package 22, a large bending stress acts on the pressure detection element 16. This can deflect the pressure detection element 16. Deflection of the pressure detection element 16 changes the distance between the substrate 30 and the membrane 32, that is, the distance between the first electrode 36A and the first diaphragm portion 32A and the distance between the second electrode 36B and the second diaphragm portion 32B, compared with those before the pressure detection element 16 is deflected. For example, the first and second diaphragm portions 32A and 32B partially move closer to or farther away from the first and second electrodes 36A and 36B, compared with those before deflection.

Such a change in distance between the first and second diaphragm portions 32A and 32B and the first and second electrodes 36A and 36B occurring due to the deflective deformation of the pressure detection element 16b occurs because the thickness of the substrate 30 and the thickness of the membrane 32 are different. In the first preferred embodiment, the thickness of the substrate 30 is preferably 200 μm, and the thickness of the membrane 32 is preferably about 3 μm to about 5 μm, for example. Also, this change in distance occurs because the first and second diaphragm portions 32A and 32B on the membrane 32 are not fixed to the substrate 30 via the spacer member 34.

When the distance between the first and second diaphragm portions 32A and 32B and the first and second electrodes 36A and 36B is changed due to the deflective deformation of the pressure detection element 16 as described above, measurement accuracy varies among a plurality of pressure detection apparatuses 10. That is, measurement accuracy of the pressure detection apparatuses 10 varies depending on the degree of deflective deformation of the pressure detection element 16.

To address this problem, the inventor of preferred embodiments of the present invention considered not reducing deflective deformation itself of the pressure detection element 16 but making the deflected shape of the substrate 30 and the deflected shape of the membrane 32 match as closely as possible in the pressure detection element 16 after deflective deformation, thus reducing a change in distance (change from that before deflective deformation) between the first and second diaphragm portions 32A and 32B and the first and second electrodes 36A and 36B occurring due to deflective deformation of the pressure detection element 16. And, to do so, the inventor considered providing the trench 30a in the substrate 30.

To confirm advantageous effects of providing the trench 30a of the substrate 30, the inventor performed a finite element method (FEM) analysis.

Figure 7:
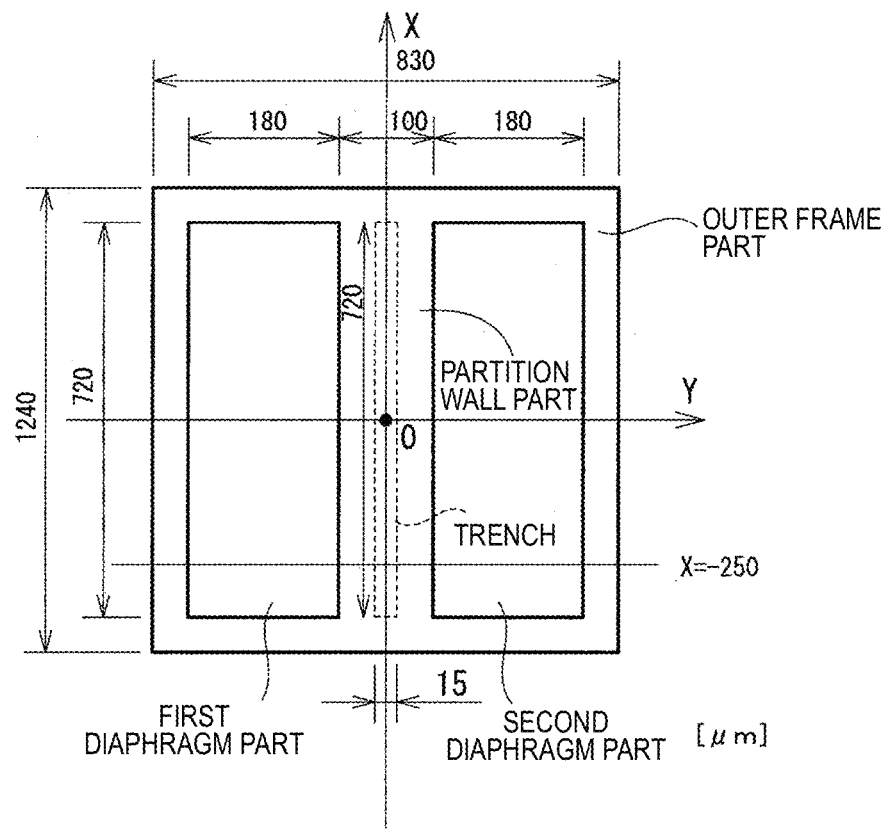
FIG. 7 is a diagram depicting specification data of a pressure detection element model used in an FEM analysis.
Figure 8A:
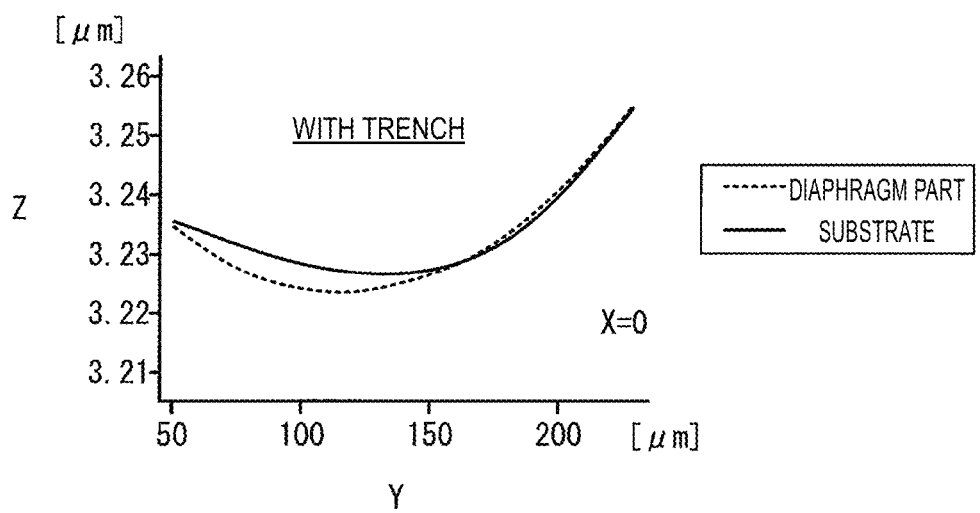
FIG. 8A is a diagram depicting displacements of a diaphragm portion and a substrate according to an example of a preferred embodiment of the present invention.
Figure 8B:
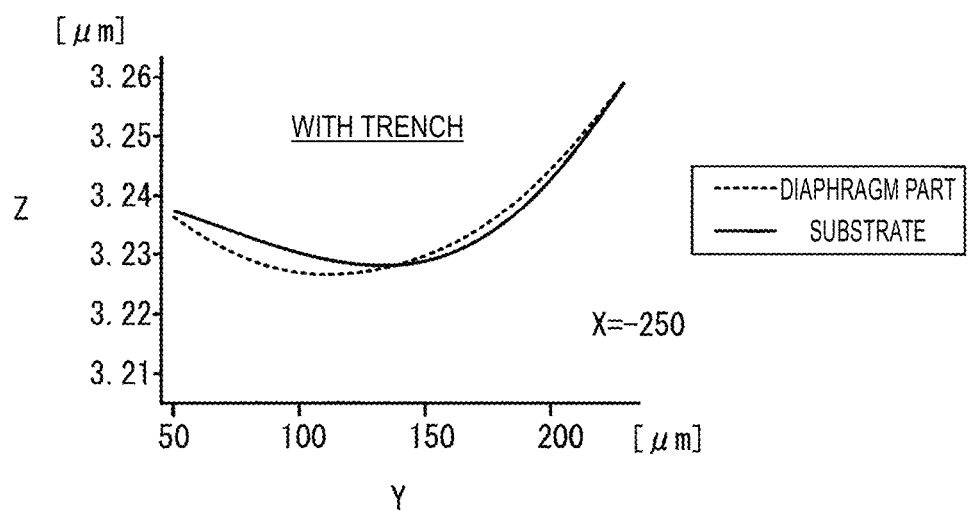
FIG. 8B is a diagram depicting displacements of a diaphragm portion and a substrate according to the example of a preferred embodiment of the present invention.
Figure 9A:
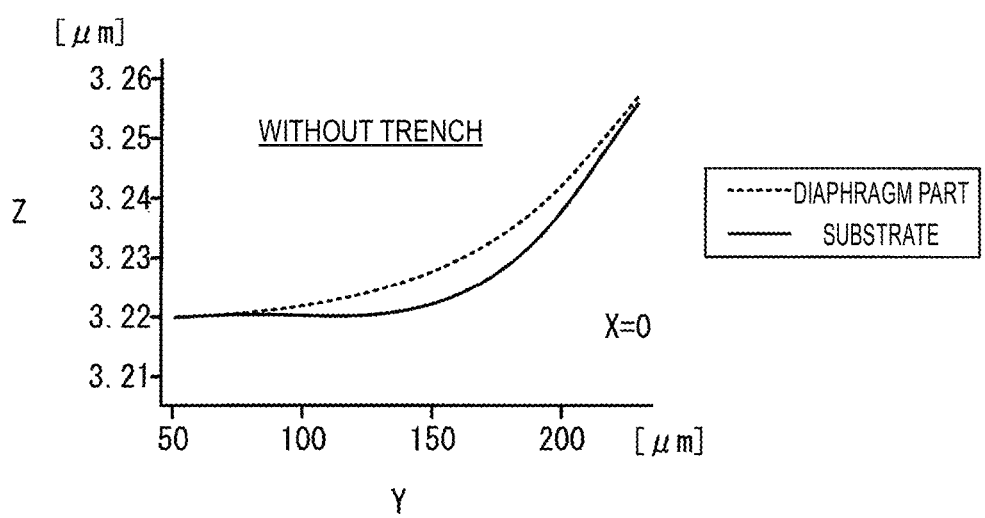
FIG. 9A is a diagram depicting displacements of a diaphragm portion and a substrate according to a comparative example.
Figure 9B:
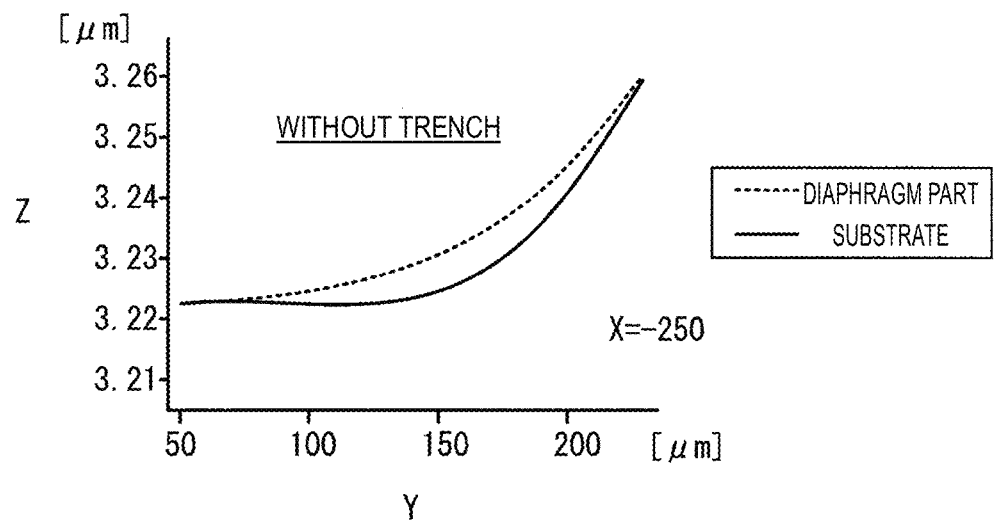
FIG. 9B is a diagram depicting displacements of a diaphragm portion and a substrate according to the comparative example.

FIG. 7 is a diagram showing specification data of a pressure detection element model used in the FEM analysis. FIGS. 8A and 8B are diagrams showing displacements of a diaphragm portion and a substrate according to an example of a preferred embodiment of the present invention. And, FIGS. 9A and 9B are diagrams depicting displacements of a diaphragm portion and a substrate according to a comparative example.

As shown in FIG. 7, in the pressure detection element model used in the FEM analysis, the first and second diaphragm portions each have a length of about 180 μm in the short direction (Y-axis direction) and a length of about 720 μm in the long direction (X-axis direction). The distance between the first and second diaphragm portions is about 100 μm. The membrane including the first and second diaphragm portions has a size of about 830 μm×about 1240 μm, and has a thickness is about 3.8 μm.

Also, the substrate has a size equal or substantially equal to the size of the membrane, and has a thickness of about 200 μm. In the substrate, a trench having a length of about 720 μm, a width of about 15 μm, and a depth of about 60 μm is provided.

Note in the FEM analysis that the used pressure detection element model is such that the first space, the second space, and the trench do not communicate. That is, in the spacer member, both ends of the partition wall portion are connected to the outer frame portion and the trench is located under the partition wall portion of the spacer member (refer to FIG. 11).

To such a pressure detection element model, an external force condition, for example, thermal stress or the like, was applied to calculate a displacement amount of the diaphragm portion occurring due to that external force and a displacement amount of a portion of the substrate opposed to that diaphragm portion. The displacement amounts of the diaphragm portion and the substrate are displacement amounts in the thickness direction (Z-axis direction), that is, in the opposing direction of the diaphragm portion and the substrate.

FIGS. 8A and 8B show a displacement amount of the second diaphragm portion and a displacement amount of a portion of the substrate opposed to that a portion when a trench is provided. On the other hand, FIGS. 9A and 9B show a displacement amount of the second diaphragm portion and a displacement amount of a portion of the substrate opposed to a portion when a trench is not provided. Here, the displacement amounts are those when viewed in the long direction (X-axis direction) of the diaphragm portion.

As can be seen from FIGS. 9A and 9B, when a trench is not provided, the displacement amount of the diaphragm portion is equal or substantially equal to that of the substrate even if the position of the diaphragm portion in the long direction (X-axis direction) varies.

On the other hand, as can be seen from FIGS. 8A and 8B, when a trench is provided, if the position of the diaphragm portion in the long direction (X-axis direction) varies, the displacement amount of each of the diaphragm portion and the substrate varies.

When a comparison is made between the case in which a trench is provided and the case in which a trench is not provided, when a trench is provided, the displacement amounts of the diaphragm portion and the substrate are large, compared with the case in which a trench is not provided. Also, when a trench is not provided, the displacement amount of the substrate remains constant or substantially constant from a portion near the center of the substrate to the center of the diaphragm portion, and then increases. By contrast, when a trench is provided, the displacement amount of the substrate decreases from a portion near the center of the substrate to the center of the diaphragm portion, and then increases.

The reason for the above-described difference depending on the presence or absence of a trench is that the center portion of the substrate becomes easily deflected due to the presence of the trench, thus causing the center portion of the substrate provided with the trench to become easily displaced. Also, while displacement of the center portion of the membrane is limited by the substrate when a trench is not provided, with the center portion of the substrate becoming easily displaced due to the trench, the center portion of the membrane is also easily displaced.

As a result, as shown in FIGS. 8A and 8B, when a trench is present, the diaphragm portion is deflected and deformed so that a center portion thereof in the short direction (Y-axis direction) is recessed over the diaphragm portion entirely in the long direction (X-axis direction), and the portion of the substrate opposed to the diaphragm portion is similarly deflected and deformed. And, when a trench is present, the deflected shape of the diaphragm portion and the deflected shape of the portion of the substrate opposed to that portion substantially match in the short direction.

Also, when the external force acting on the pressure detection element varies, it is estimated that the deflected shape of the diaphragm portion and the deflected shape of the portion of the substrate opposed to that portion can be made to substantially match in the short direction if the length, width, depth, and cross-sectional shape of the trench are appropriately set. Note that when the pressure detection element is designed to have robustness against stress, even if the external force acting on the pressure detection element varies, the deflected shape of the diaphragm portion and the deflected shape of the portion of the substrate opposed to that portion substantially match.

When a trench is absent, if the external force acting on the pressure detection element varies and, for example, if the external force increases, it is estimated that the difference in the displacement amount between the center portion of the diaphragm portion in the short direction (Y-axis direction) and the substrate increases.

Note that the deflected shape of the diaphragm portion and the deflected shape of the substrate in the long direction (X-axis direction) of the diaphragm portion substantially match, irrespective of the presence or absence of a trench. Strictly speaking, the degree of matching is slightly higher when a trench is not provided.

In summary of the results of the FEM analysis, with a trench provided in the substrate, the deflected shape of the diaphragm portion and the deflected shape of the portion of the substrate opposed to that portion substantially match when the pressure detection element is deflected by receiving an external force. This keeps the distance between the diaphragm portion and the portion (that is, electrode) of the substrate opposed to that portion similar to the distance in the pressure detection element not received an external force and not deflected and deformed.

Note that, in the first preferred embodiment, as shown in FIG. 5, the first space RA, the second space RB, and the trench 30a communicate via the communication paths 34a. The reason for this is to let the pressure in the first and second spaces RA and RB increased by deflection of the first and second diaphragm portions 32A and 32B escape to the inside of the trench 30a and also to let the pressure in the first and second spaces RA and RB increased by expansion of gas in the first and second spaces RA and RB escape to the inside of the trench 30a when the temperature under the measurement environment is high. When the pressure in the first and second spaces RA and RB becomes excessively high, the first and second diaphragm portions 32A and 32B become hard to deflect toward the first and second electrodes 36A and 36B.

According to the first preferred embodiment as described above, in the electrostatic-capacitive pressure detection element, it is possible to reduce a change in distance between the diaphragm and the electrodes on the substrate occurring as a result of deflection of the pressure detection element.

Second Preferred Embodiment

A second preferred embodiment of the present invention is the same or substantially the same as the first preferred embodiment, except that the first space and the second space do not communicate. Therefore, a pressure detection element according to the second preferred embodiment is described by focusing mainly on differences. Note that a component the same or substantially the same as a component of the first preferred embodiment is provided with the same reference character.

Figure 10:
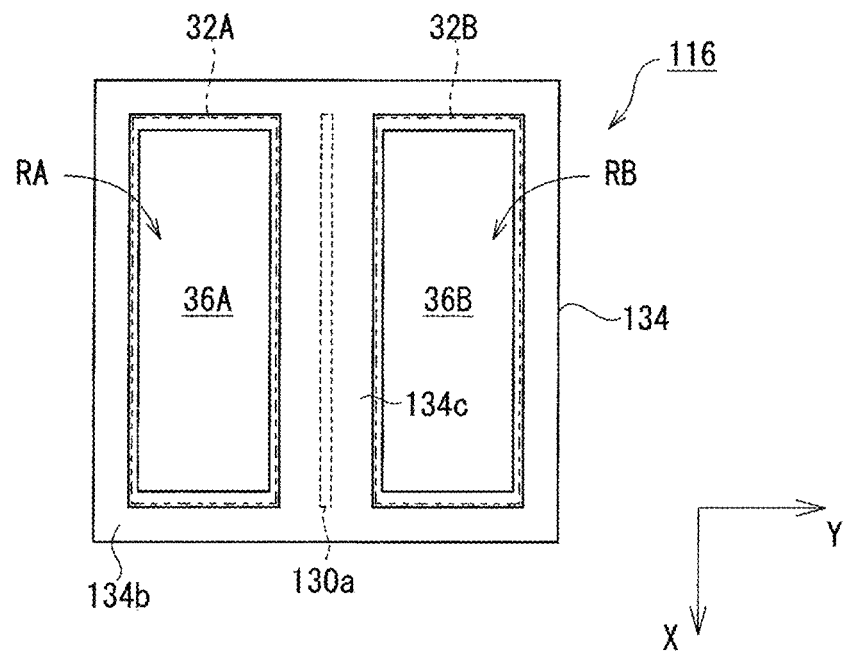
FIG. 10 is a top view of a pressure detection element according to a second preferred embodiment of the present invention with a membrane omitted.
Figure 11:
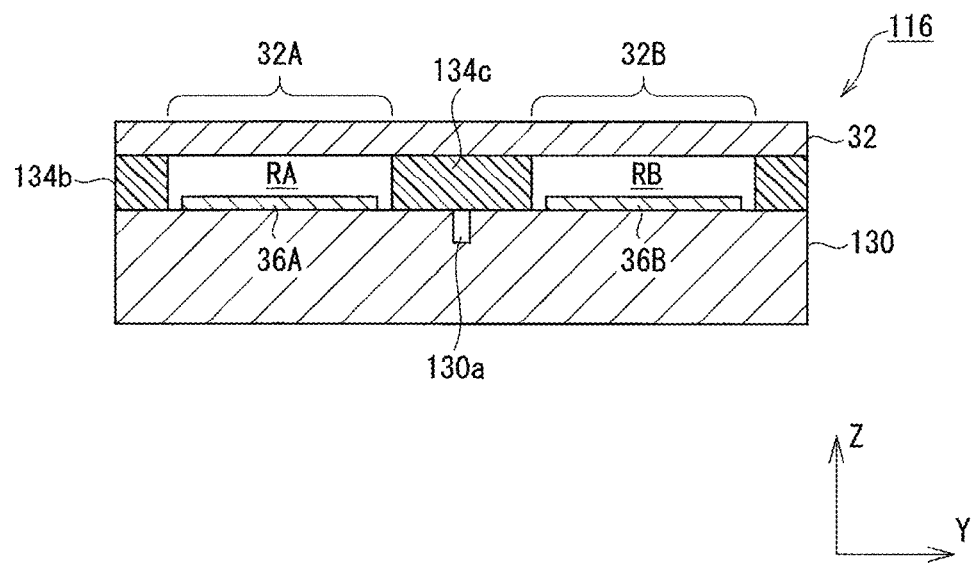
FIG. 11 is a sectional view of the pressure detection element according to the second preferred embodiment of the present invention.

FIG. 10 is a top view of the pressure detection element according to the second preferred embodiment with a membrane omitted. FIG. 11 is a sectional view of the pressure detection element according to the second preferred embodiment.

As shown in FIG. 10, in a pressure detection element 116 according to the second preferred embodiment, the first space RA and the second space RB are independent from each other and do not communicate. That is, both ends of a partition wall portion 134c in the long direction (X-axis direction) are connected to an outer frame portion 134b of a spacer member 134. Also as shown in FIG. 11, a trench 130a of a substrate 130 is positioned under the partition wall portion 134c of the spacer member 134.

Also according to the second preferred embodiment, as with the first preferred embodiment, in the electrostatic-capacitive pressure detection element, it is possible to reduce a change in distance between the diaphragm and the electrodes on the substrate occurring as a result of deflection of the pressure detection element.

Third Preferred Embodiment

A third preferred embodiment of the present invention is an improved preferred embodiment of the second preferred embodiment. Therefore, a pressure detection element according to the third preferred embodiment is described by focusing mainly on differences. Note that a component the same or substantially the same as a component of the second preferred embodiment is provided with the same reference character.

Figure 12:
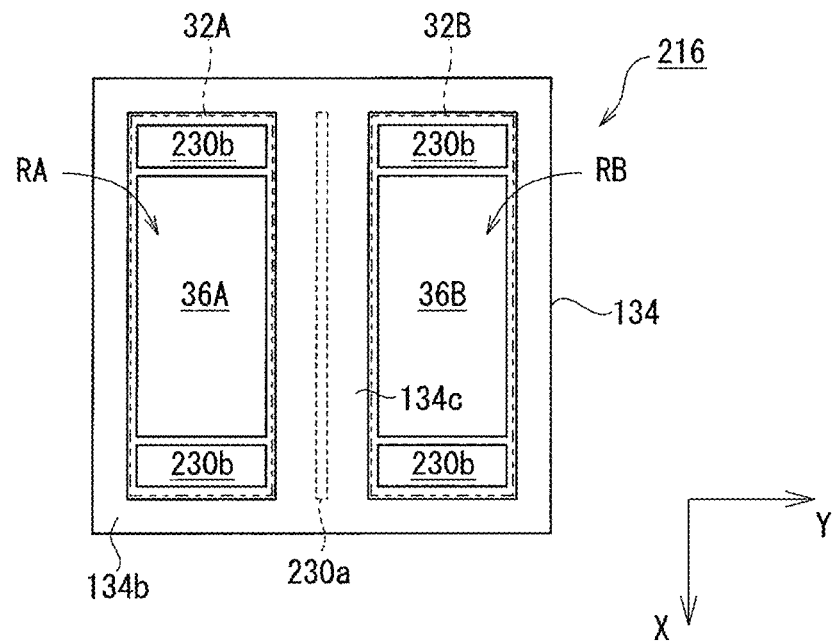
FIG. 12 is a top view of a pressure detection element according to a third preferred embodiment of the present invention with a membrane omitted.
Figure 13:
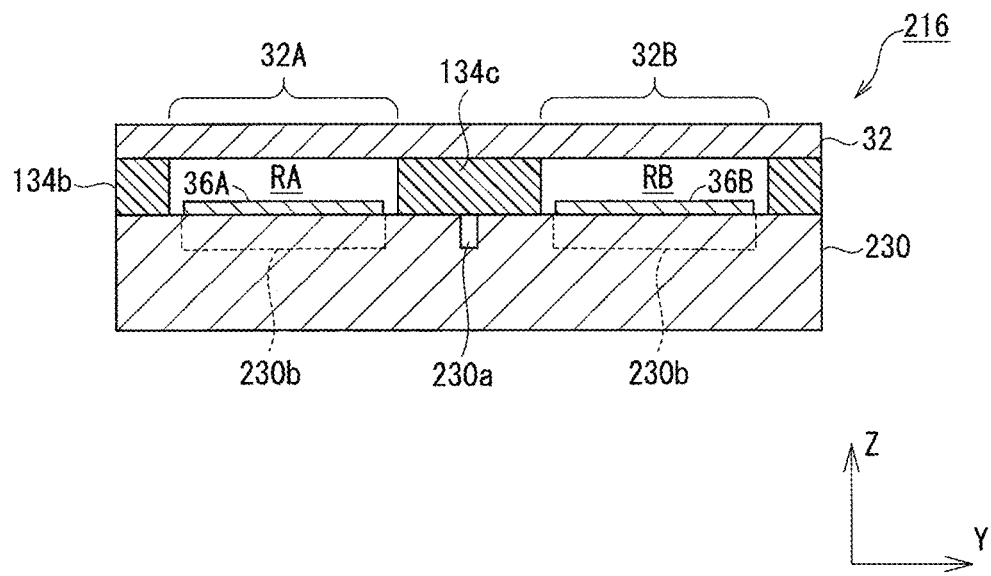
FIG. 13 is a sectional view of the pressure detection element according to the third preferred embodiment of the present invention.

FIG. 12 is a top view of the pressure detection element according to the third preferred embodiment with a membrane omitted. FIG. 13 is a sectional view of the pressure detection element according to the third preferred embodiment.

As shown in FIG. 12 and FIG. 13, a plurality of cavities 230b are provided in portions of a substrate 230 facing the first space RA and the second space RB, respectively. In a pressure detection element 216 of the third preferred embodiment, one set of cavities 230b interposes the first electrode 36A in the long direction (X-axis direction) of the first diaphragm portion 32A, and one set of cavities 230b interposes the second electrode 36B in the long direction of the second diaphragm portion 32B. In the third preferred embodiment, each cavity 230b extends in the short direction (Y-axis direction) of the first and second diaphragm portions 32A and 32B, and has a length in the extending direction equal or substantially equal to the length of the first and second diaphragm portions 32A and 32B in the short direction.

The reason why the plurality of these cavities 230b are provided is to let the pressure in the first and second spaces RA and RB increased by deflection of the first and second diaphragm portions 32A and 32B escape to the inside of these cavities 230b and also to let the pressure in the first and second spaces RA and RB increased by expansion of gas in the first and second spaces RA and RB escape to the inside of these cavities 230b when the temperature under the measurement environment is high. When the pressure in the first and second spaces RA and RB becomes excessively high, the first and second diaphragm portions 32A and 32B become hard to deflect toward the first and second electrodes 36A and 36B.

Also according to the third preferred embodiment, as with the first and second preferred embodiments, in the electrostatic-capacitive pressure detection element, it is possible to reduce a change in distance between the diaphragm and the electrodes on the substrate occurring due to the occurrence of deflection of the pressure detection element.

Fourth Preferred Embodiment

A fourth preferred embodiment of the present invention is an improved preferred embodiment of the third preferred embodiment. Therefore, a pressure detection element according to the fourth preferred embodiment is described by focusing mainly on differences. Note that a component the same or substantially the same as a component of the above-described third preferred embodiment is provided with the same reference character.

Figure 14:
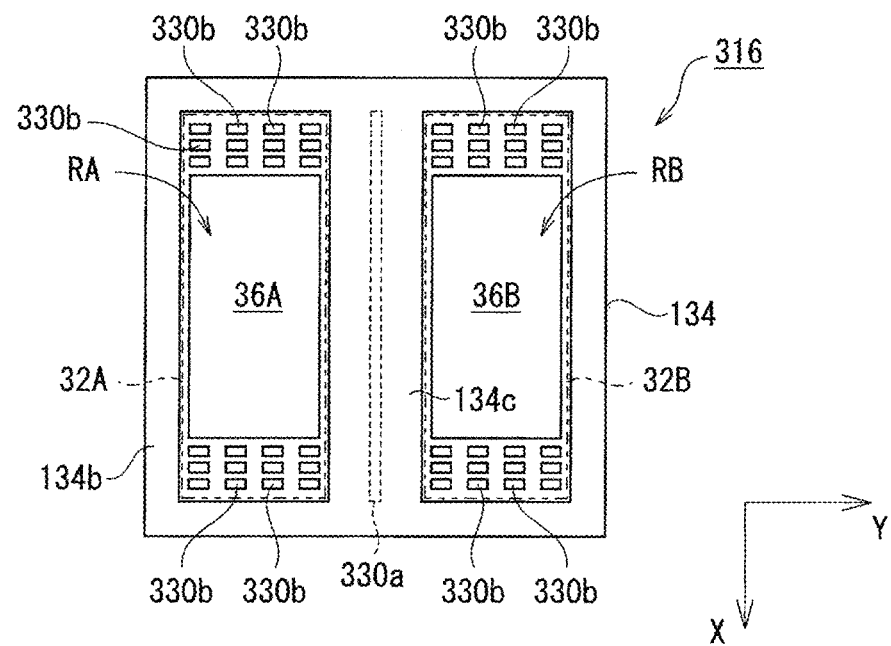
FIG. 14 is a top view of a pressure detection element according to a fourth preferred embodiment of the present invention with a membrane omitted.

FIG. 14 is a top view of the pressure detection element according to the fourth preferred embodiment with a membrane omitted.

As shown in FIG. 14, also in a pressure detection element 316 of the fourth preferred embodiment, as with the third preferred embodiment, a plurality of cavities 330b are provided in portions of a substrate 330 facing the first space RA and the second space RB, respectively. However, in the fourth preferred embodiment, the cavities 330b are arranged in a matrix near both ends of each of the first and second electrodes 36A and 36B in the long direction (X-axis direction).

In the third preferred embodiment, as shown in FIG. 12, the cavities 230b extend in the portions of the substrate 230 respectively opposed to the first and second diaphragm portions 32A and 32B entirely or substantially entirely over the short direction (Y-axis direction). On the other hand, in the fourth preferred embodiment, the cavities 330b do not extend in the portions of the substrate 330 respectively opposed to the first and second diaphragm portions 32A and 32B entirely or substantially entirely over the short direction.

With this, the portions of the substrate 330 respectively opposed to the first and second diaphragm portions 32A and 32B can be deflected and deformed, in particular, in the short direction (Y-axis direction), without being influenced by the cavities 330b. For specific description, like the cavities 230b of the third preferred embodiment, if cavities are provided in the portions of the substrate opposed to the diaphragm portions entirely or substantially entirely over the short direction, deflective deformation of those portions of the substrate in the short direction is limited by the cavities, depending on (the magnitude and direction of) the external force acting on the pressure detection element. As a result, the deflected shape of the diaphragm portions and the deflected shape of the opposed portions of the substrate become hard to match. Therefore, depending on the external force acting on the pressure detection element, like the cavities 330b of the fourth preferred embodiment, the cavities preferably do not extend in the portions of the substrate opposed to the diaphragm portions entirely or substantially entirely over the short direction.

Note that it is more preferable not to provide the cavities in the center of the portions of the substrate opposed to the diaphragm portions in the short direction.

Figure 15:
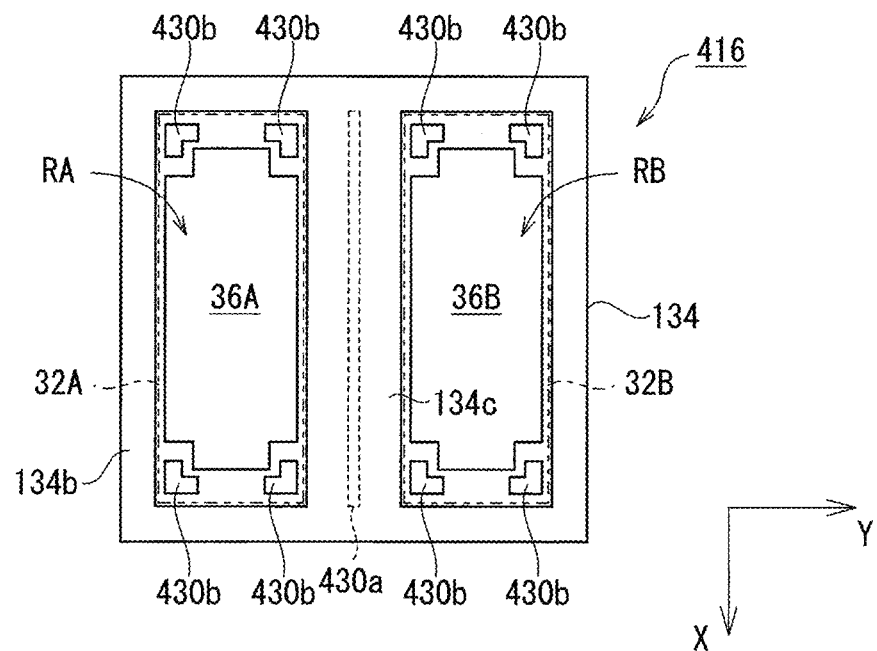
FIG. 15 is a top view of a pressure detection element according to an improved modification of the fourth preferred embodiment of the present invention with a membrane omitted.

FIG. 15 is a top view of a pressure detection element according to an improved modification of the fourth preferred embodiment with a membrane omitted.

As shown in FIG. 15, in a pressure detection element 416 according to the improved modification of the fourth preferred embodiment, a plurality of cavities 430b are provided in portions of a substrate 430 facing the first space RA and the second space RB, respectively, so as to be positioned at four corners of each of the first and second spaces RA and RB when viewed in a direction in which the substrate 430 and the membrane 32 are opposed (viewed in the Z-axis direction). This enables the portions of the substrate 430 opposed to the first and second diaphragm portions 32A and 32B to deflect in the short direction (Y-axis direction) without being limited by the cavities 430b.

Also according to the fourth preferred embodiment, as with the first to third preferred embodiments, in the electrostatic-capacitive pressure detection element, it is possible to reduce a change in distance between the diaphragm and the electrodes on the substrate occurring due to the occurrence of deflection of the pressure detection element.

Fifth Preferred Embodiment

A fifth preferred embodiment of the present invention is an improved modification of the third preferred embodiment, and is different in the first and second electrodes. Therefore, a pressure detection element according to the fifth preferred embodiment is described by focusing mainly on differences. Note that a component the same or substantially the same as a component of the above-described third preferred embodiment is provided with the same reference character.

Figure 16:
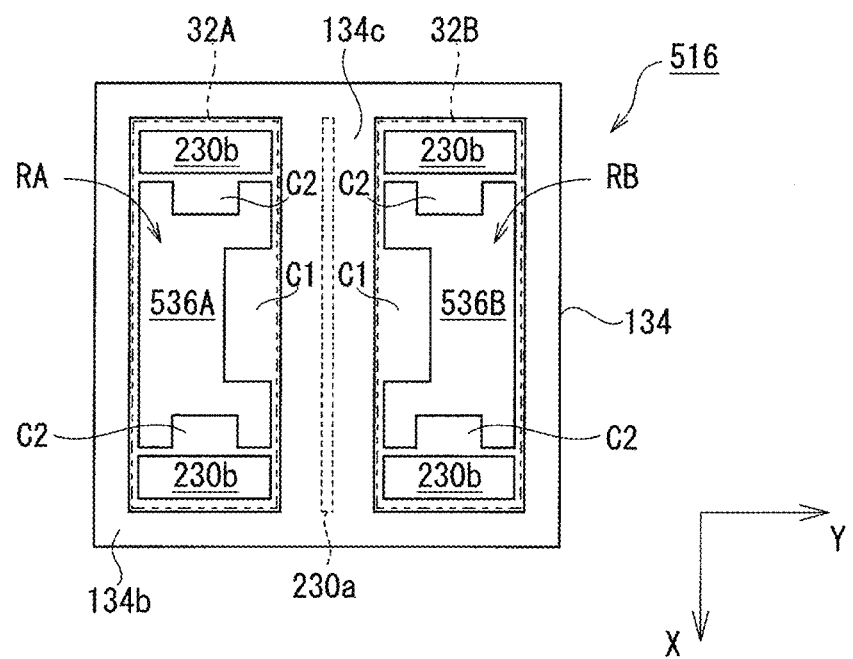
FIG. 16 is a top view of a pressure detection element according to a fifth preferred embodiment of the present invention with a membrane omitted.
Figure 17:
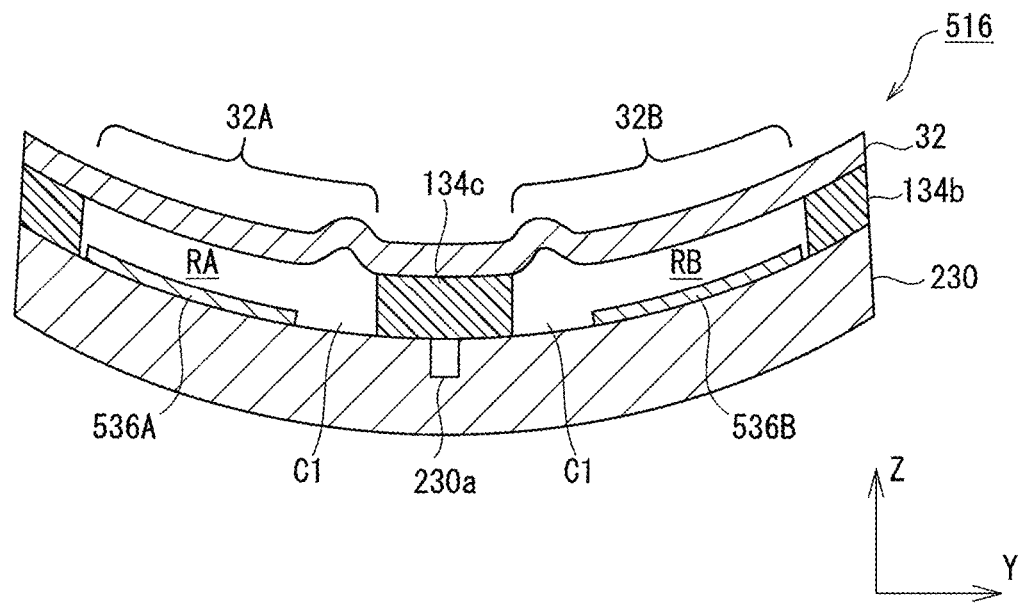
FIG. 17 is a sectional view of the pressure detection element according to the fifth preferred embodiment of the present invention in a state of deflective deformation.

FIG. 16 is a top view of the pressure detection element according to the fifth preferred embodiment with a membrane omitted. FIG. 17 is a sectional view of the pressure detection element according to the fifth preferred embodiment in a state of deflective deformation.

As shown in FIG. 16, in a pressure detection element 516 according to the fifth preferred embodiment, first and second electrodes 536A and 536B each have a shape different from those of the above-described other first to fourth preferred embodiments. Specifically, the first and second electrodes 536A and 536B have rectangular or substantially rectangular shapes similar to the first and second diaphragm portions 32A and 32B and having a long direction (X-axis direction) and a short direction (Y-axis direction), the rectangular or substantially rectangular shapes each include a plurality of concave portions C1 and C2. The concave portions C1 are provided at the center or approximate center of the edges on a center side of the membrane, that is, on a partition wall portion 134c side of the spacer member 134. The concave portions C2 are provided at edges on both ends in the long direction.

Depending on the external force acting on the pressure detection element 516, portions where deformation different from deformation in other portions occurs can be included in the first and second diaphragm portions 32A and 32B. For example, as shown in FIG. 17, portions near the partition wall portion 134c in the first and second diaphragm portions 32A and 32B are significantly bent, unlike deflective deformation of the other portions.

When pressure is calculated based on the electrostatic capacitance between the electrodes and the diaphragm portions including such portions where deformation significantly different from that in the other portions occurs, a large error occurs between that calculated value and the value of pressure actually acting on the diaphragm portions.

To address this, in the fifth preferred embodiment, the concave portions C1 and C2 are provided at positions on the first and second electrodes 536A and 536B opposed to portions of the first and second diaphragm portions 32A and 32B where deformation significantly different from that in the other portions can occur. With these concave portions C1 and C2, pressure can be calculated with high accuracy based on the electrostatic capacitance between the first and second diaphragm portions 32A and 32B and the first and second electrodes 536A and 536B.

Also according to the fifth preferred embodiment, as with the above-described first to fourth preferred embodiments, in the electrostatic-capacitive pressure detection element, it is possible to reduce a change in distance between the diaphragm and the electrodes on the substrate occurring as a result of deflection of the pressure detection element.

While the present invention has been described with reference to the first to fifth preferred embodiments, the present invention is not limited to these preferred embodiments.

For example, in the third preferred embodiment, as shown in FIG. 12, the substrate 230 is provided with one trench 230a. However, the preferred embodiments of the present invention are not limited to this.

Sixth Preferred Embodiment

Figure 18:
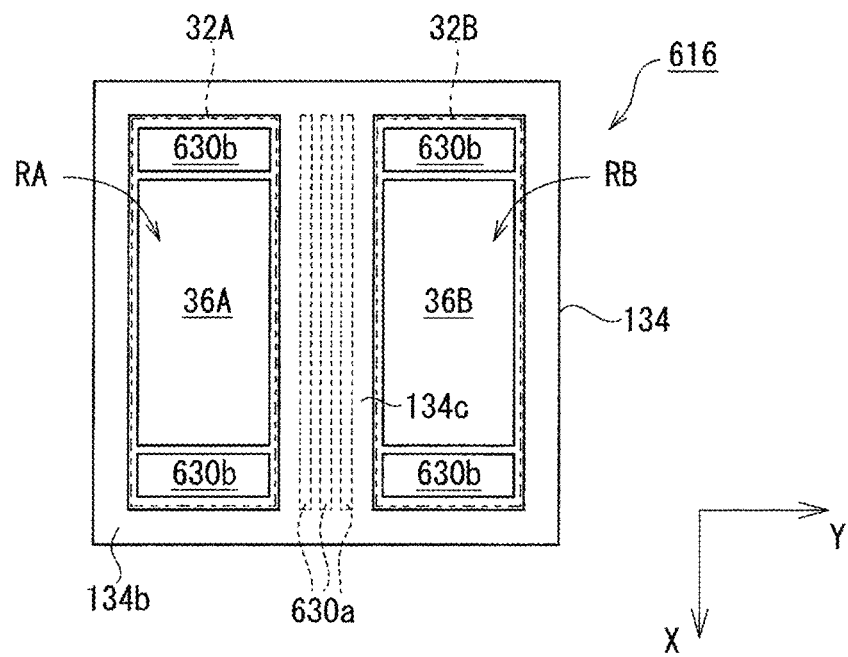
FIG. 18 is a top view of a pressure detection element according to a sixth preferred embodiment of the present invention with a membrane omitted.

FIG. 18 is a top view of a pressure detection element according to a sixth preferred embodiment of the present invention with a membrane omitted.

In a pressure detection element 616 according to the sixth preferred embodiment, unlike the pressure detection element 216 of the third preferred embodiment shown in FIG. 12, three trenches 630a are provided in a substrate 630. The three trenches 630a may have the same shape or different shapes. By adjusting the number of trenches 630a or adjusting the length, width, and depth of each trench 630a, the deflected shapes of the first and second diaphragm portions 32A and 32B and the deflected shapes of the opposed portions of the substrate 630 can be made to more closely match.

Also, for example, in the above-described preferred embodiments, for example, in the second preferred embodiment shown in FIG. 11, the trench 130a is provided in a surface on a membrane 32 side in the substrate 130. However, the preferred embodiments of the present invention are not limited to this.

Seventh Preferred Embodiment

Figure 19:
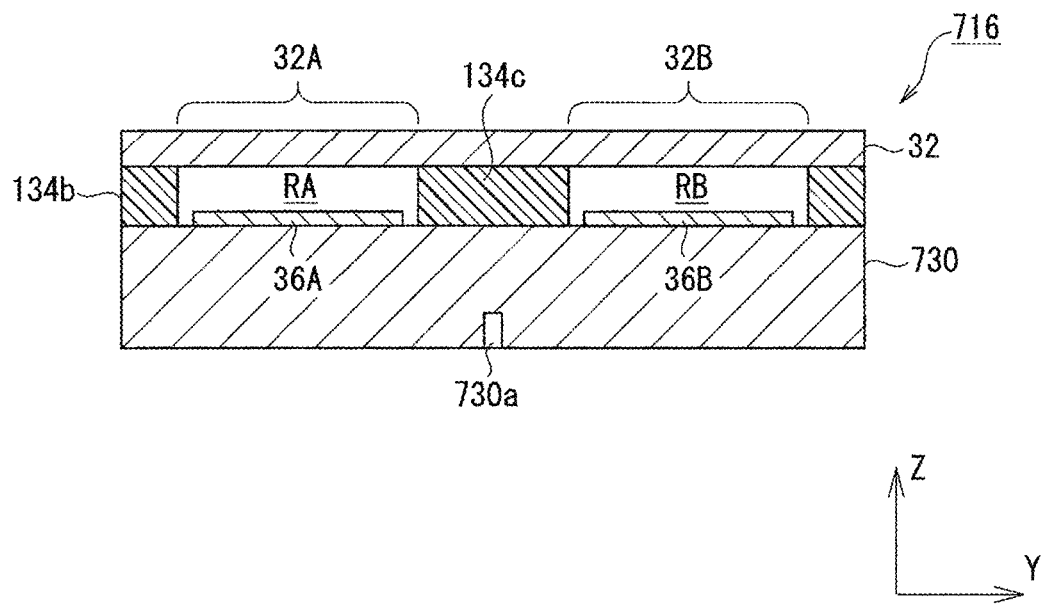
FIG. 19 is a sectional view of a pressure detection element according to a seventh preferred embodiment of the present invention.

FIG. 19 is a sectional view of a pressure detection element according to a seventh preferred embodiment of the present invention.

As shown in FIG. 19, in a pressure detection element 716 according to the seventh preferred embodiment, a trench 730a is provided in a surface opposite to a surface on the membrane side at which the first and second electrodes 36A and 36B are provided in a substrate 730.

Furthermore, in the above-described preferred embodiments, for example, in the third preferred embodiment shown in FIG. 12, the first space RA and the second space RB are provided in the pressure detection element 216 as spaces where the diaphragm portions and the electrodes are opposed. That is, two pairs of a diaphragm portion and an electrode are provided in one pressure detection element. However, the preferred embodiments of the present invention are not limited to this.

Eighth and Ninth Preferred Embodiments

Figure 20:
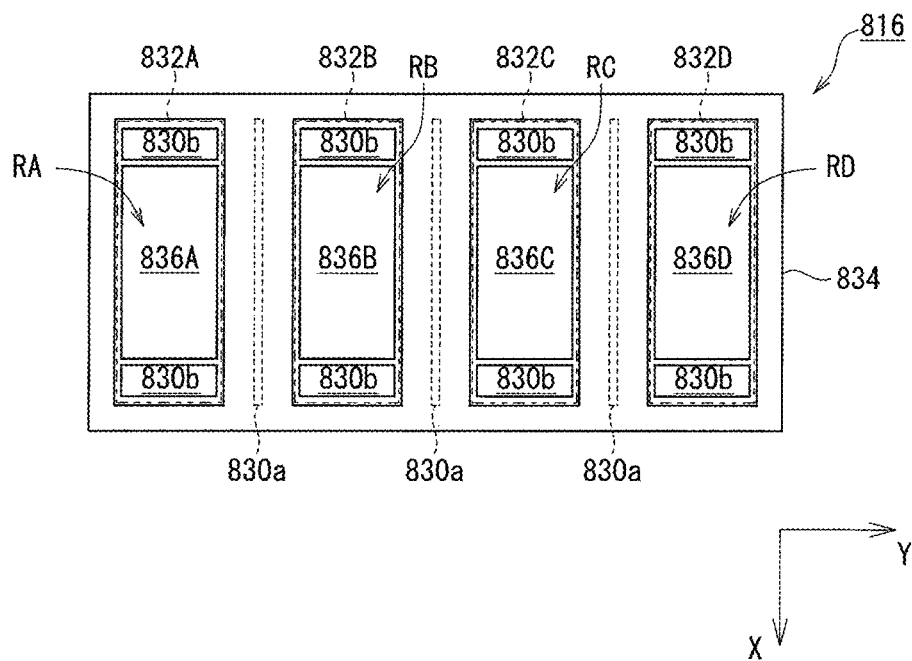
FIG. 20 is a top view of a pressure detection element according to an eighth preferred embodiment of the present invention with a membrane omitted.
Figure 21:
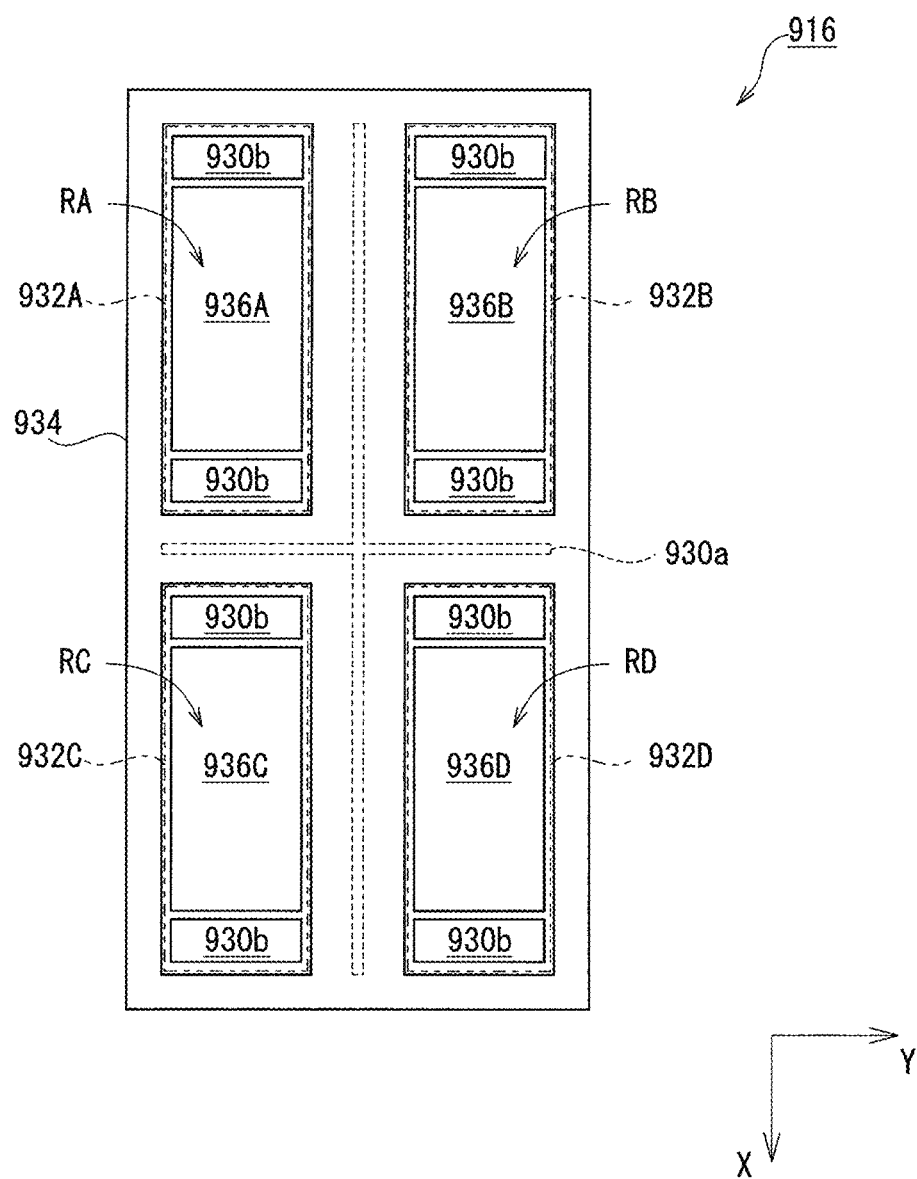
FIG. 21 is a top view of a pressure detection element according to a ninth preferred embodiment of the present invention with a membrane omitted.

FIG. 20 is a top view of a pressure detection element according to an eighth preferred embodiment of the present invention with a membrane omitted. FIG. 21 is a top view of a pressure detection element according to a ninth preferred embodiment of the present invention with a membrane omitted.

In a pressure detection element 816 shown in FIG. 20 and a pressure detection element 916 shown in FIG. 21, four spaces where the diaphragm portions and the electrodes are opposed are provided, that is, the first space RA, the second space RB, a third space RC, and a fourth space RD are provided.

As shown in FIG. 20, in the pressure detection element 816 according to the eighth preferred embodiment, the membrane includes four diaphragm portions, that is, a first diaphragm portion 832A, a second diaphragm portion 832B, a third diaphragm portion 832C, and a fourth diaphragm portion 832D. The four diaphragm portions 832A to 832D are each aligned in short direction (Y-axis direction). The first diaphragm portion 832A and a first electrode 836A are opposed in the first space RA, the second diaphragm portion 832B and a second electrode 836B are opposed in the second space RB, the third diaphragm portion 832C and a third electrode 836C are opposed in the third space RC, and the fourth diaphragm portion 832D and a fourth electrode 836D are opposed in the fourth space RD. When viewed in a direction in which a substrate and a membrane are opposed (Z-axis direction), trenches 830a are provided between the first diaphragm portion 832A and the second diaphragm portion 832B, between the second diaphragm portion 832B and the third diaphragm portion 832C, and between the third diaphragm portion 832C and the fourth diaphragm portion 832D, respectively.

As shown in FIG. 21, in the pressure detection element 916 according to the ninth preferred embodiment, the membrane includes four diaphragm portions, that is, a first diaphragm portion 932A, a second diaphragm portion 932B, a third diaphragm portion 932C, and a fourth diaphragm portion 932D. The four diaphragm portions 932A to 932D are arranged in a 2×2 matrix. The first diaphragm portion 932A and a first electrode 936A are opposed in the first space RA, the second diaphragm portion 932B and a second electrode 936B are opposed in the second space RB, the third diaphragm portion 932C and a third electrode 936C are opposed in the third space RC, and the fourth diaphragm portion 932D and a fourth electrode 936D are opposed in the fourth space RD. When viewed in a direction in which a substrate and a membrane are opposed (Z-axis direction), trenches 930a define a cross shape. Specifically, the trenches 930a define a cross shape extending from the center or approximate center of the substrate between the first diaphragm portion 932A and the second diaphragm portion 932B, between the third diaphragm portion 932C and the fourth diaphragm portion 932D, between the first diaphragm portion 932A and the third diaphragm portion 932C, and between the second diaphragm portion 932B and the fourth diaphragm portion 932D, respectively.

Furthermore, in the first preferred embodiment, as shown in FIG. 5, the trench 30a defines and functions as a refuge to which the increased pressure in the first and second spaces RA and RB escapes. Also, in the third preferred embodiment, as shown in FIG. 12 and FIG. 13, the cavities 230b for letting the increased pressure in the first and second spaces RA and RB escape are provided. However, in the preferred embodiments of the present invention, the refuge to which the increased pressure in the first and second spaces RA and RB escapes is not limited to trenches or cavities.

Tenth Preferred Embodiment

Figure 22:
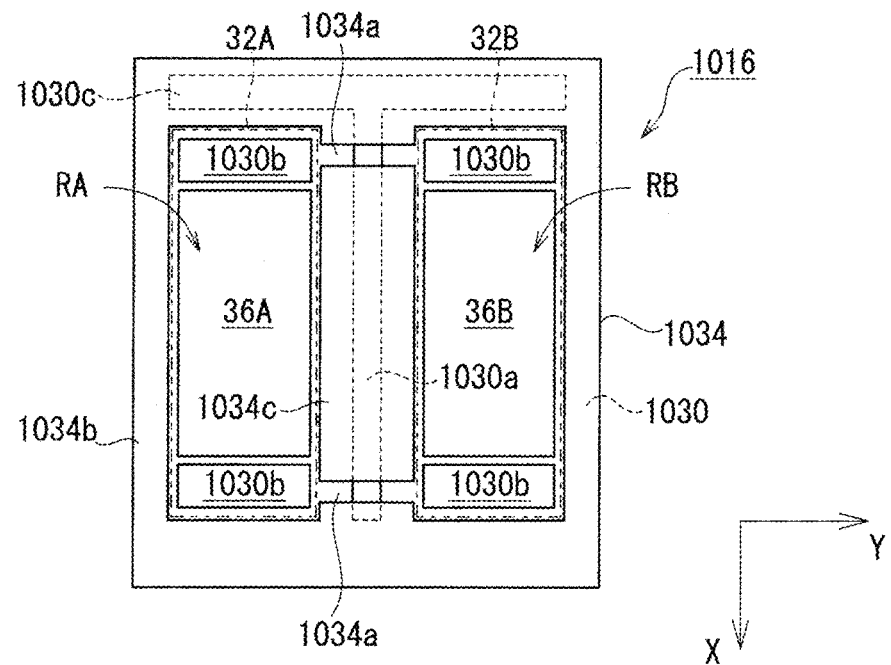
FIG. 22 is a top view of a pressure detection element according to a tenth preferred embodiment of the present invention with a membrane omitted.
Figure 23:
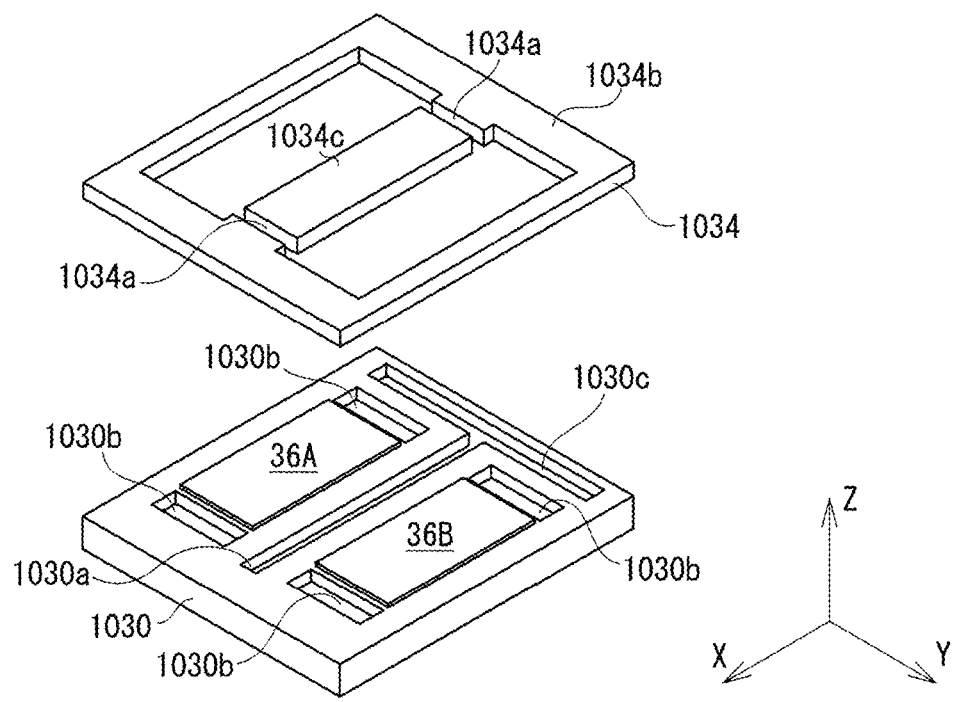
FIG. 23 is an exploded perspective view of the pressure detection element according to the tenth preferred embodiment of the present invention with the membrane omitted.

FIG. 22 is a top view of a pressure detection element according to a tenth preferred embodiment with a membrane omitted. FIG. 23 is an exploded perspective view of the pressure detection element according to the tenth preferred embodiment with the membrane omitted.

As shown in FIG. 22 and FIG. 23, a pressure detection element 1016 according to the tenth preferred embodiment includes an additional space 1030c for letting the increased pressure in the first and second spaces RA and RB escape. Here, the additional space 1030c is a space defined by covering a recess provided in a substrate 1030 with a spacer member 1034.

Also, the additional space 1030c is located at a position in an outer side portion of the first and second diaphragm portions 32A and 32B except a portion therebetween, when viewed in a direction in which the substrate 1030 and the membrane are opposed (Z-axis direction). In the tenth preferred embodiment, when viewed in a direction in which the substrate 1030 and the membrane are opposed (Z-axis direction), the additional space 1030c is located in the outer side portion of the first and second diaphragm portions 32A and 32B in the long direction (X-axis direction) and extends to a parallel or substantially parallel direction (Y-axis direction) of the first and second diaphragm portions 32A and 32B.

In the tenth preferred embodiment, the additional space 1030c is connected to a trench 1030a. Also, the trench 1030a is connected to communication paths 1034a which are provided in the spacer member 1034 and via which the first and second spaces RA and RB communicate. That is, the additional space 1030c communicates with the first and second spaces RA and RB via the trench 1030a and the communication paths 1034a.

In the pressure detection element 1016 according to the tenth preferred embodiment, when the pressure in the first and second spaces RA and RB increases, the increased pressure can escape to the trench 1030a, cavities 1030b, and the additional space 1030c.

Note that the cavities 1030*b* can be omitted if the additional space 1030*c* has a sufficient size.

By providing the additional space 1030*c* as described above, irrespective of the temperature (ambient temperature) under the measurement environment, the pressure in the first and second spaces RA and RB can be maintained constant or substantially constant. Also, since the additional space 1030*c* is located at a position in the outer side portion of the first and second diaphragm portions 32A and 32B except a portion therebetween, when viewed in the direction in which the substrate 1030 and the membrane are opposed (Z-axis direction), without impairing the above-described advantageous effects of the trench 1030*a*, that is, the advantageous effect of making the deflected shape of the diaphragm portion and the deflected shape of the portion of the substrate opposed to that portion substantially match when the pressure detection element is deflected by receiving an external force, the pressure in the first and second spaces RA and RB can be maintained constant or substantially constant. This is described with reference to examples.

Figure 24:
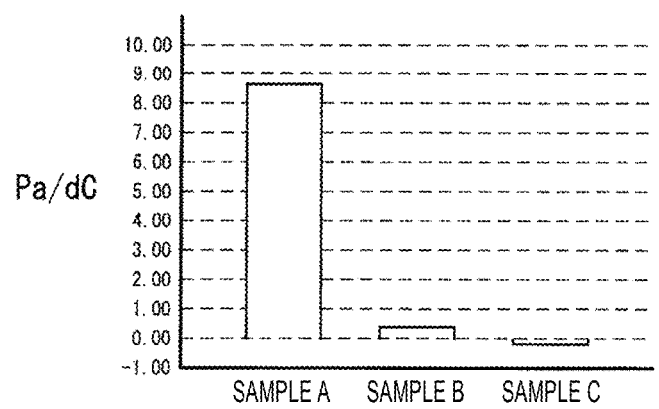
FIG. 24 is a graph indicating thermal drift of pressure in first and second spaces in each of samples of a plurality of different pressure detection elements.

FIG. 24 indicates thermal drift of pressure in first and second spaces in each of samples of a plurality of different pressure detection elements.

In FIG. 24, a sample A is a pressure detection element according to a comparative example having a configuration in which the trench 1030*a* and the additional space 1030*c* are removed from the pressure detection element 1016 of the tenth preferred embodiment; a sample B is a pressure detection element having a configuration in which the cavities 1030*b* and the additional space 1030*c* are removed from the pressure detection element 1016 of the tenth preferred embodiment, that is, the pressure detection element 16 of the first preferred embodiment; and a sample C is a pressure detection element having a configuration in which the cavities 1030*b* are removed from the pressure detection element 1016 of the tenth preferred embodiment, that is, the pressure detection element according to a modified example of the tenth preferred embodiment.

As shown in FIG. 24, since the sample A is configured not to be provided with a trench and an additional space but to be provided only with cavities, if the ambient temperature changes, the pressure in the first and second spaces RA and RB significantly changes. That is, the thermal drift amount of pressure, which is a pressure change amount per unit temperature, is large.

Since the sample B is configured not to be provided with cavities and an additional space but to be provided only with a trench, even if the ambient temperature changes, the pressure in the first and second spaces RA and RB only slightly changes. That is, the thermal drift amount of pressure is small.

Since the sample C is configured not to be provided with cavities but to be provided with a trench and an additional space, even if the ambient temperature changes, the pressure in the first and second spaces RA and RB does not substantially change. That is, the thermal drift amount of pressure is substantially zero.

Depending on the specifications of the pressure detection element such as the size and layout of the first and second diaphragm portions 32A and 32B (that is, the first and second spaces RA and RB), the size and layout of the trench 1030*a* and the cavities 1030*b* have limitations. And, in some cases, it may not be possible to sufficiently reduce an increase in pressure due to a high temperature under the measurement environment only with trench 1030*a* and cavities 1030*b*, that is, it may not be possible to make the thermal drift amount of pressure substantially zero. Thus, by further providing the additional space 1030*c*, the thermal drift amount of pressure can be made substantially zero. As a result, irrespective of the temperature under the measurement environment, the pressure in the first and second spaces RA and RB can be maintained constant or substantially constant.

There are various configurations of the above-described additional space. Thus, a plurality of pressure detection elements according to preferred embodiments with different additional spaces are described below.

Figure 25:
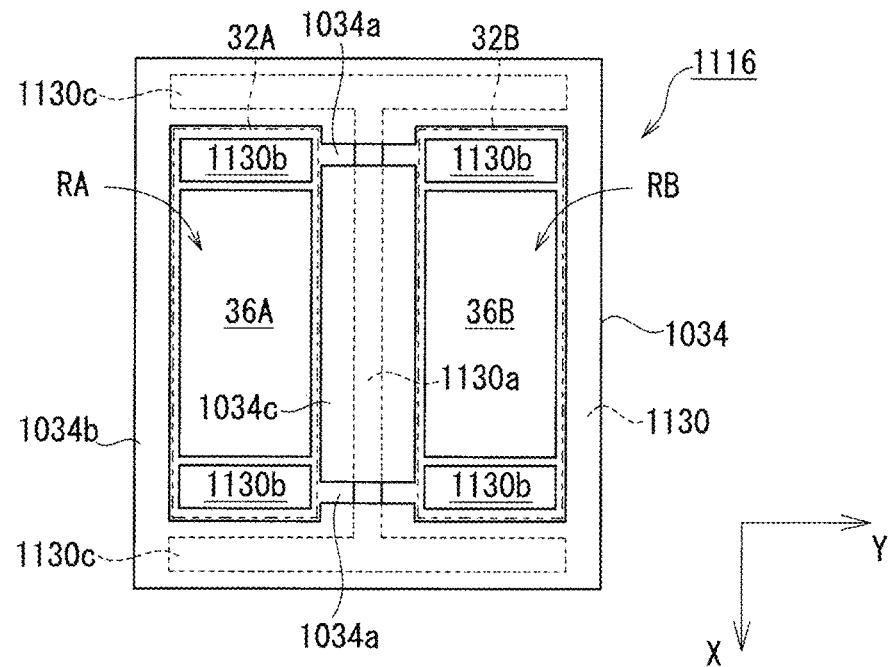
FIG. 25 is a top view of a pressure detection element according to an eleventh preferred embodiment of the present invention with a membrane omitted.

Eleventh Preferred Embodiment (01531 FIG. 25 is a top view of a pressure detection element according to an eleventh preferred embodiment of the present invention with a membrane omitted.

As shown in FIG. 25, a pressure detection element 1116 according to the eleventh preferred embodiment includes two additional spaces 1130*c*. When viewed in the direction in which a substrate 1130 and the membrane are opposed (Z-axis direction), the two additional spaces 1130*c* are each located in an outer side portion of the first and second diaphragm portions 32A and 32B in the long direction (X-axis direction) so that the first and second diaphragm portions 32A and 32B are positioned therebetween, and also extend in a parallel or substantially parallel direction (Y-axis direction) of the first and second diaphragm portions 32A and 32B. Furthermore, one additional space 1130*c* is connected to one end of a trench 1130*a*, and the other additional space 1130*c* is connected to the other end of the trench 1130*a*. And, the trench 1130*a* is connected to the communication paths 1034*a* which are provided in the spacer member 1034 and via which the first and second spaces RA and RB communicate. That is, the two additional spaces 1130*c* communicate with the first and second spaces RA and RB via the trench 1130*a* and the communication paths 1034*a*.

In the eleventh preferred embodiment, the increased pressure in the first and second spaces RA and RB can escape to the trench 1130*a*, cavities 1130*b*, and the two additional spaces 1130*c*.

Twelfth Preferred Embodiment

Figure 26:
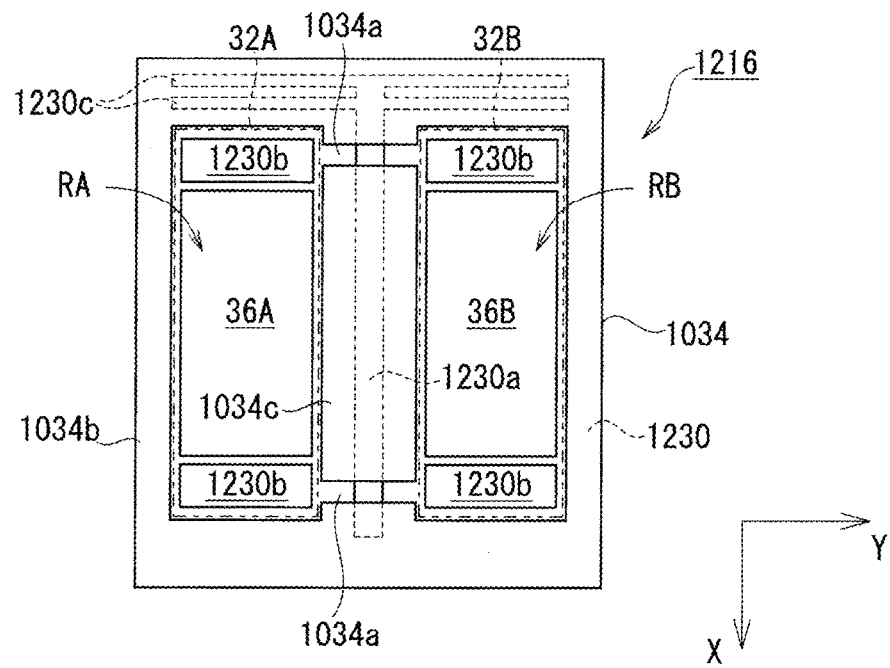
FIG. 26 is a top view of a pressure detection element according to a twelfth preferred embodiment of the present invention with a membrane omitted.

FIG. 26 is a top view of a pressure detection element according to a twelfth preferred embodiment of the present invention with a membrane omitted.

As shown in FIG. 26, a pressure detection element 1216 according to the twelfth preferred embodiment includes two additional spaces 1230*c*. When viewed in the direction in which a substrate 1230 and the membrane are opposed (Z-axis direction), the two additional spaces 1230*c* are each arranged, in a state of being adjacent to each other in parallel or substantially in parallel, in an outer side portion of the first and second diaphragm portions 32A and 32B in the long direction (X-axis direction). Also, one end of a trench 1230*a* is connected to the two additional spaces 1230*c*. And, the trench 1230*a* is connected to the communication paths 1034*a* which are provided in the spacer member 1034 and via which the first and second spaces RA and RB communicate. That is, the two additional spaces 1230*c* communicate with the first and second spaces RA and RB via the trench 1230*a* and the communication paths 1034*a*.

In the twelfth preferred embodiment, the increased pressure in the first and second spaces RA and RB can escape to the trench 1230*a*, cavities 1230*b*, and the two additional spaces 1230*c*.

Thirteenth Preferred Embodiment

Figure 27:
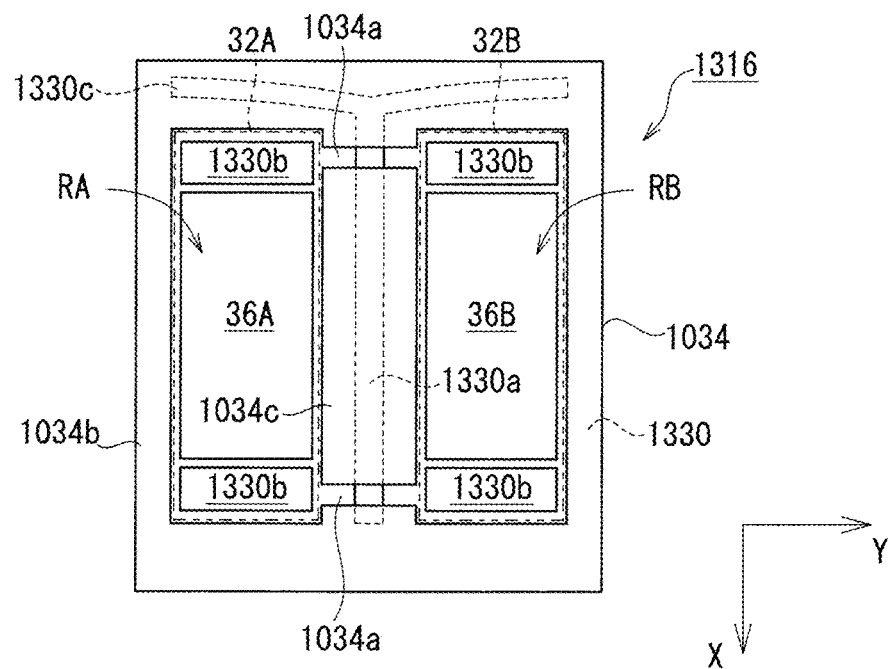
FIG. 27 is a top view of a pressure detection element according to a thirteenth preferred embodiment of the present invention with a membrane omitted.

FIG. 27 is a top view of a pressure detection element according to a thirteenth preferred embodiment of the present invention with a membrane omitted.

As shown in FIG. 27, in a pressure detection element 1316 according to the thirteenth preferred embodiment, the shape of an additional space 1330c is different from the shapes of the additional spaces 1030c, 1130c, and 1230c in the tenth to twelfth preferred embodiments. That is, in the thirteenth preferred embodiment, the shape of the additional space 1330c is not linear but is curved when viewed in a direction in which a substrate 1330 and the membrane are opposed (Z-axis direction).

In the thirteenth preferred embodiment, when viewed in a direction in which the substrate 1330 and the membrane are opposed (Z-axis direction), the additional space 1330c is located in the outer side portion of the first and second diaphragm portions 32A and 32B in the long direction (X-axis direction) and extends in a parallel or substantially parallel direction (Y-axis direction) of the first and second diaphragm portions 32A and 32B. Also, the additional space 1330c is connected to a trench 1330a. Also, the trench 1330a is connected to the communication paths 1034a which are provided in the spacer member 1034 and via which the first and second spaces RA and RB communicate. That is, the additional space 1330c communicates with the first and second spaces RA and RB via the trench 1330a and the communication paths 1034a.

In the thirteenth preferred embodiment, the increased pressure in the first and second spaces RA and RB can escape to the trench 1330a, cavities 1330b, and the curved additional space 1330c.

Fourteenth Preferred Embodiment

Figure 28:
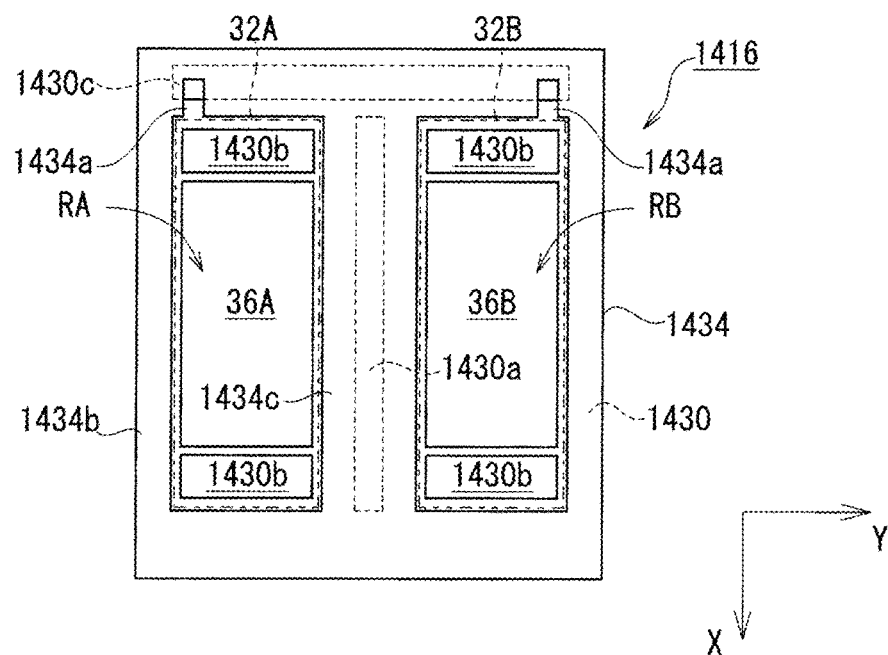
FIG. 28 is a top view of a pressure detection element according to a fourteenth preferred embodiment of the present invention with a membrane omitted.
Figure 29:
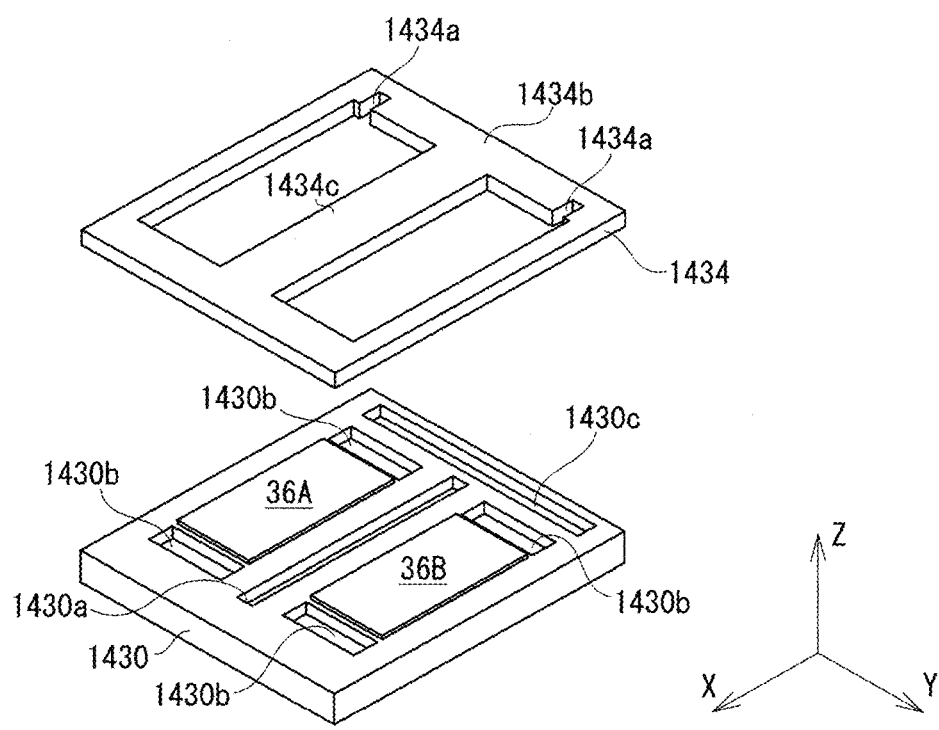
FIG. 29 is an exploded perspective view of the pressure detection element according to the fourteenth preferred embodiment of the present invention with the membrane omitted.

FIG. 28 is a top view of a pressure detection element according to a fourteenth preferred embodiment of the present invention with a membrane omitted. FIG. 29 is an exploded perspective view of the pressure detection element according to the fourteenth preferred embodiment with the membrane omitted.

The additional spaces 1030c, 1130c, 1230c, and 1330c in the tenth to thirteenth preferred embodiments communicate with the first and second spaces RA and RB via the trenches 1030a, 1130a, 1230a, and 1330a, respectively. In the fourteenth preferred embodiment, as shown in FIG. 28 and FIG. 29, an additional space 1430c communicates with the first and second spaces RA and RB not via a trench 1430a.

Specifically, in the fourteenth preferred embodiment, when viewed in the direction in which a substrate 1430 and the membrane are opposed (Z-axis direction), the additional space 1430c is located in an outer side portion of the first and second diaphragm portions 32A and 32B in the long direction (X-axis direction) and extends in a parallel or substantially parallel direction (Y-axis direction) of the first and second diaphragm portions 32A and 32B. A spacer member 1434 is provided with two communication paths 1434a via which the first and second spaces RA and RB and the additional space 1430c communicate. The first space RA and the additional space 1430c communicate via one communication path 1434a. The second space RB and the additional space 1430c communicate via the other communication path 1434a. As a result, the first and second spaces RA and RB communicate with each other via an additional space 1430c, and the additional space 1430c is not connected to the trench 1430a.

In the fourteenth preferred embodiment, the increased pressure in the first and second spaces RA and RB can escape to cavities 1430b and the additional space 1430c.

As shown in the tenth to fourteenth preferred embodiments, the number and shape of the additional spaces are not limited. That is, the additional space is a space different from the first and second spaces RA and RB, and is a space provided in the pressure detection element to communicate with the first and second spaces RA and RB via a trench or not via a trench. Also, the additional space may be provided in the substrate, may be provided in the spacer member, or may be provided in both of these.

While the present invention has been described above with reference to a plurality of preferred embodiments, at least one preferred embodiment can be entirely or partially combined with another preferred embodiment to make still another preferred embodiment according to the present invention.

Preferred embodiments of the present invention can be applied to electrostatic-capacitive pressure detection elements.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A pressure detection element comprising:
   a substrate;
   first and second electrodes on the substrate;
   a membrane including a first diaphragm portion and a second diaphragm portion, the membrane being spaced from the substrate; and
   a spacer between the substrate and the membrane to define a first space in which the first electrode and the first diaphragm portion are spaced from and opposed to each other, and a second space in which the second electrode and the second diaphragm portion are spaced from and opposed to each other; wherein
   the substrate includes a trench in a portion between the first diaphragm portion and the second diaphragm portion when viewed in a direction in which the substrate and the membrane are opposed;
   when viewed in the direction in which the substrate and the membrane are opposed, the trench does not overlap with any diaphragm portion included in the membrane;
   the first and second diaphragm portions each have a rectangular or substantially rectangular shape having a long direction and a short direction, when viewed in the direction in which the substrate and the membrane are opposed, and are aligned to the short direction; and
   the trench extends in the long direction.

2. The pressure detection element according to claim 1, wherein the trench is provided in a surface of the substrate on a membrane side.

3. The pressure detection element according to claim 1, wherein the trench has a length in an extending direction equal to or longer than a length of the first and second diaphragm portions in the long direction.

4. The pressure detection element according to claim 1, wherein when viewed in the direction in which the substrate and the membrane are opposed, the first and second electrodes each include at least either of concave portions provided at a center or approximate center of edges on both ends in the long direction and concave portions provided at a center or approximate center of edges on a center side of the membrane.

5. The pressure detection element according to claim 1, wherein cavities are provided in portions of the substrate facing the first and second spaces so as to interpose the first and second electrodes in the long direction when viewed in the direction in which the substrate and the membrane are opposed.

6. The pressure detection element according to claim 1, wherein cavities are provided in the substrate so as to be positioned at four corners of each of the first and second spaces when viewed in the direction in which the substrate and the membrane are opposed.

7. The pressure detection element according to claim 1, wherein the spacer includes communication paths via which the first space, the second space, and the trench communicate.

8. The pressure detection element according to claim 1, wherein
an additional space is provided;
the additional space is located at a position in an outer side portion of the first and second diaphragm portions except a portion between the first and second diaphragm portions, when viewed in the direction in which the substrate and the membrane are opposed; and
the additional space communicates with the first and second spaces.

9. The pressure detection element according to claim 1, wherein
the trench is provided at a center or approximate center in the substrate in a parallel or substantially parallel direction of the first diaphragm portion and the second diaphragm portion; and
the first and second diaphragm portions are symmetric with respect to the trench.

10. A pressure detection apparatus comprising:
the pressure detection element according to claim 1; and
a resin package including the pressure detection element buried therein and including an exposure hole from which the first and second diaphragm portions of the pressure detection element are exposed to outside.

11. The pressure detection apparatus according to claim 10, wherein the trench is provided in a surface of the substrate on a membrane side.

12. The pressure detection apparatus according to claim 10, wherein the trench has a length in an extending direction equal to or longer than a length of the first and second diaphragm portions in the long direction.

13. The pressure detection apparatus according to claim 10, wherein when viewed in the direction in which the substrate and the membrane are opposed, the first and second electrodes each include at least either of concave portions provided at a center or approximate center of edges on both ends in the long direction and concave portions provided at a center or approximate center of edges on a center side of the membrane.

14. The pressure detection apparatus according to claim 10, wherein cavities are provided in portions of the substrate facing the first and second spaces so as to interpose the first and second electrodes in the long direction when viewed in the direction in which the substrate and the membrane are opposed.

15. The pressure detection apparatus according to claim 10, wherein cavities are provided in the substrate so as to be positioned at four corners of each of the first and second spaces when viewed in the direction in which the substrate and the membrane are opposed.

16. The pressure detection apparatus according to claim 10, wherein the spacer includes communication paths via which the first space, the second space, and the trench communicate.

17. The pressure detection apparatus according to claim 10, wherein
an additional space is provided;
the additional space is located at a position in an outer side portion of the first and second diaphragm portions except a portion between the first and second diaphragm portions, when viewed in the direction in which the substrate and the membrane are opposed; and
the additional space communicates with the first and second spaces.

18. The pressure detection apparatus according to claim 10, wherein
the trench is provided at a center or approximate center in the substrate in a parallel or substantially parallel direction of the first diaphragm portion and the second diaphragm portion; and
the first and second diaphragm portions are symmetric with respect to the trench.

* * * * *